United States Patent
Kacian et al.

(10) Patent No.: US 8,052,944 B2
(45) Date of Patent: *Nov. 8, 2011

(54) PENETRABLE CAP

(75) Inventors: Daniel L. Kacian, San Diego, CA (US); Mark R. Kennedy, Madison, CT (US); Nick M. Carter, Galt, CA (US)

(73) Assignee: Gen-Probe Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/753,010

(22) Filed: Apr. 1, 2010

(65) Prior Publication Data
US 2010/0190215 A1 Jul. 29, 2010

Related U.S. Application Data

(60) Continuation of application No. 11/869,233, filed on Oct. 9, 2007, now Pat. No. 7,691,332, which is a continuation of application No. 10/954,578, filed on Sep. 29, 2004, now Pat. No. 7,294,308, which is a division of application No. 10/093,511, filed on Mar. 8, 2002, now Pat. No. 6,893,612.

(60) Provisional application No. 60/274,493, filed on Mar. 9, 2001.

(51) Int. Cl.
*B65D 41/20* (2006.01)
*B01L 3/02* (2006.01)

(52) U.S. Cl. ........ 422/570; 422/500; 422/512; 422/513; 422/534; 422/547; 422/550; 422/568; 215/247; 215/248; 215/249; 215/250; 436/177; 436/180

(58) Field of Classification Search ............... 422/99, 422/100, 101, 102, 916, 500, 501, 512, 513, 422/527, 534, 535, 547, 549, 550, 558, 568, 422/570; 436/174, 177, 180; 435/6.1; 215/247–250, 258, 232; 73/864.74
See application file for complete search history.

(56) References Cited

U.S. PATENT DOCUMENTS
651,460 A 6/1900 Higgins
1,080,891 A 12/1913 Carson
(Continued)

FOREIGN PATENT DOCUMENTS
CA 1 209 004 A 8/1986
(Continued)

OTHER PUBLICATIONS

Defendant Becton, Dickinson and Company's Patent L.R. 3.3 Preliminary Invalidity Contentions (with Exhibits A-H), *Gen-Probe Incorporated v. Becton Dickinson and Company*, Civil Action No. 09 CV 2319, United States District Court for the Southern District of California, Jun. 11, 2010.

(Continued)

*Primary Examiner* — Maureen M Wallenhorst
(74) *Attorney, Agent, or Firm* — Charles B. Cappellari

(57) ABSTRACT

A cap having a core structure dimensioned to receive a pipette therethrough. The cap includes two axially aligned frangible seals that are affixed to the core structure in a spaced-apart relationship. The frangible seals include a foil layer and are constructed so that air passageways are formed between the frangible seals and a pipette tip when the pipette tip penetrates the frangible seals. The cap optionally includes a filter interposed between the first and second frangible seals.

37 Claims, 12 Drawing Sheets

U.S. PATENT DOCUMENTS

| | | | |
|---|---|---|---|
| 1,108,645 A | 8/1914 | Weissenthanner |
| 1,184,568 A | 5/1916 | Puhl |
| 1,413,703 A | 4/1922 | Biehn |
| 1,431,871 A | 10/1922 | Burnet |
| 1,509,916 A | 9/1924 | Waite |
| 1,702,182 A | 2/1929 | Van Vlijmen |
| 2,099,370 A | 11/1937 | Monnier |
| 2,163,367 A | 6/1939 | Barnes |
| 2,186,888 A | 1/1940 | Tullar et al. |
| 2,200,600 A | 5/1940 | Grapp |
| 2,240,101 A | 4/1941 | Smith |
| 2,906,423 A | 9/1959 | Sandhage |
| 3,088,615 A | 5/1963 | Mumford et al. |
| 3,146,904 A | 9/1964 | Hansen et al. |
| 3,194,424 A | 7/1965 | Barr |
| 3,392,859 A | 7/1968 | Fischer |
| 3,439,824 A | 4/1969 | Merrill, Jr. et al. |
| 3,460,702 A | 8/1969 | Andrews |
| 3,495,993 A | 2/1970 | Barr et al. |
| 3,519,157 A | 7/1970 | Meierhoefer |
| 3,552,591 A | 1/1971 | Wimmer |
| 3,578,037 A | 5/1971 | Flynn |
| 3,593,909 A | 7/1971 | Bergmann |
| 3,607,098 A | 9/1971 | Strande |
| 3,676,076 A | 7/1972 | Grady |
| 3,720,343 A | 3/1973 | Irish, Jr. |
| 3,938,686 A | 2/1976 | Milligan et al. |
| 4,053,084 A | 10/1977 | Anderson |
| 4,072,233 A | 2/1978 | Kramer et al. |
| 4,103,772 A | 8/1978 | Wiegner |
| 4,105,133 A | 8/1978 | La Barge et al. |
| 4,134,512 A | 1/1979 | Nugent |
| 4,146,148 A | 3/1979 | Dwinell et al. |
| 4,152,269 A | 5/1979 | Babson |
| 4,171,236 A | 10/1979 | Winchell et al. |
| 4,178,976 A | 12/1979 | Weiler et al. |
| 4,193,698 A | 3/1980 | Gartner |
| 4,209,126 A | 6/1980 | Elias |
| 4,217,327 A | 8/1980 | Cancio et al. |
| 4,222,974 A | 9/1980 | Smith |
| 4,226,333 A | 10/1980 | Percarpio |
| 4,234,103 A | 11/1980 | Strobl, Jr. et al. |
| 4,236,646 A | 12/1980 | Ganz, Jr. et al. |
| 4,243,150 A | 1/1981 | Gunne et al. |
| 4,247,001 A | 1/1981 | Wiegner |
| 4,248,355 A | 2/1981 | Kolb et al. |
| 4,254,884 A * | 3/1981 | Maruyama .................... 215/232 |
| 4,261,474 A | 4/1981 | Cohen |
| 4,265,242 A | 5/1981 | Cohen |
| 4,266,687 A | 5/1981 | Cummings |
| 4,278,437 A | 7/1981 | Haggar |
| 4,301,936 A | 11/1981 | Percarpio |
| 4,304,869 A | 12/1981 | Dyke |
| 4,412,623 A | 11/1983 | Schmidt |
| 4,418,827 A | 12/1983 | Butterfield |
| 4,465,200 A | 8/1984 | Percarpio |
| 4,515,752 A | 5/1985 | Miramanda |
| 4,519,513 A | 5/1985 | Weiler et al. |
| 4,524,809 A | 6/1985 | Dent |
| 4,531,649 A | 7/1985 | Shull |
| 4,539,855 A | 9/1985 | Jacobs |
| 4,545,497 A | 10/1985 | Martha, Jr. |
| 4,562,859 A * | 1/1986 | Shames et al. ................. 137/414 |
| 4,576,297 A | 3/1986 | Larson |
| 4,582,207 A | 4/1986 | Howard et al. |
| 4,600,112 A | 7/1986 | Shillington et al. |
| 4,640,424 A | 2/1987 | White |
| 4,652,429 A | 3/1987 | Konrad |
| 4,655,763 A | 4/1987 | Malcolm et al. |
| 4,664,274 A | 5/1987 | Konrad |
| 4,682,703 A | 7/1987 | Kasai et al. |
| 4,685,917 A | 8/1987 | Baldini et al. |
| 4,693,834 A | 9/1987 | Hossom |
| 4,697,717 A | 10/1987 | Grippi |
| 4,703,865 A | 11/1987 | Bates |
| 4,706,827 A | 11/1987 | Cabernoch et al. |
| 4,722,449 A | 2/1988 | Dubach |
| 4,732,850 A | 3/1988 | Brown et al. |
| 4,747,500 A | 5/1988 | Gach et al. |
| 4,789,639 A | 12/1988 | Fleming |
| 4,795,043 A | 1/1989 | Odet et al. |
| 4,803,998 A | 2/1989 | Kezes et al. |
| 4,808,381 A | 2/1989 | McGregor et al. |
| 4,811,856 A | 3/1989 | Fischman |
| 4,815,618 A | 3/1989 | Gach |
| 4,815,619 A | 3/1989 | Turner et al. |
| 4,817,807 A * | 4/1989 | Hummer ....................... 215/253 |
| 4,849,173 A | 7/1989 | Chang |
| 4,863,051 A | 9/1989 | Eibner et al. |
| 4,863,453 A | 9/1989 | Berger et al. |
| 4,873,193 A | 10/1989 | Jensen et al. |
| 4,886,177 A | 12/1989 | Foster |
| 4,892,222 A | 1/1990 | Schmidt et al. |
| 4,898,293 A | 2/1990 | Morel |
| 4,920,976 A | 5/1990 | Calzi et al. |
| 4,948,009 A | 8/1990 | Sawatani |
| 4,957,637 A | 9/1990 | Cornell |
| 4,961,986 A | 10/1990 | Galda et al. |
| 4,981,464 A | 1/1991 | Suzuki |
| 4,995,521 A | 2/1991 | Von Schuckmann |
| D315,680 S | 3/1991 | Baxter |
| 4,999,163 A | 3/1991 | Lennon et al. |
| 5,016,770 A | 5/1991 | Rizzardi |
| 5,024,327 A | 6/1991 | Shillington |
| 5,036,992 A | 8/1991 | Mouchawar et al. |
| 5,053,134 A | 10/1991 | Luderer et al. |
| 5,057,365 A | 10/1991 | Finkelstein et al. |
| 5,061,263 A | 10/1991 | Yamazaki et al. |
| 5,065,768 A | 11/1991 | Coleman et al. |
| 5,070,884 A | 12/1991 | Columbus et al. |
| 5,071,017 A | 12/1991 | Stull |
| 5,078,968 A | 1/1992 | Nason |
| 5,084,393 A | 1/1992 | Rogalsky |
| 5,088,996 A | 2/1992 | Kopfer et al. |
| 5,100,010 A | 3/1992 | Waters |
| 5,102,010 A | 4/1992 | Osgar et al. |
| 5,111,946 A | 5/1992 | Glanz |
| 5,130,254 A | 7/1992 | Collier et al. |
| 5,165,560 A | 11/1992 | Ennis, III et al. |
| 5,169,602 A | 12/1992 | Pang et al. |
| 5,188,620 A | 2/1993 | Jepson et al. |
| 5,188,628 A | 2/1993 | Rani et al. |
| 5,201,459 A | 4/1993 | Bettle, Jr. et al. |
| 5,202,093 A | 4/1993 | Cloyd |
| 5,234,001 A | 8/1993 | Goldstein et al. |
| 5,275,299 A | 1/1994 | Konrad et al. |
| 5,279,606 A | 1/1994 | Haber et al. |
| 5,294,011 A | 3/1994 | Konrad et al. |
| 5,295,599 A | 3/1994 | Smith |
| 5,297,599 A * | 3/1994 | Bucheli ........................ 141/329 |
| 5,303,838 A | 4/1994 | Luch et al. |
| 5,306,054 A | 4/1994 | Georgopoulos |
| 5,306,270 A | 4/1994 | Macartney et al. |
| 5,308,506 A | 5/1994 | McEwen et al. |
| 5,326,534 A | 7/1994 | Yamazaki et al. |
| 5,328,041 A | 7/1994 | Hook et al. |
| 5,358,690 A | 10/1994 | Guirguis |
| 5,370,252 A | 12/1994 | Parsons et al. |
| 5,395,365 A | 3/1995 | Weiler et al. |
| 5,397,023 A | 3/1995 | Toczek et al. |
| D357,985 S | 5/1995 | Burns |
| 5,429,619 A | 7/1995 | Furnish |
| 5,433,330 A | 7/1995 | Yatsko et al. |
| 5,433,716 A | 7/1995 | Leopardi et al. |
| 5,471,706 A | 12/1995 | Wallock et al. |
| 5,494,170 A | 2/1996 | Burns |
| 5,501,676 A | 3/1996 | Niedospial et al. |
| 5,505,326 A | 4/1996 | Junko |
| 5,514,339 A | 5/1996 | Leopardi et al. |
| 5,522,518 A | 6/1996 | Konrad et al. |
| 5,525,304 A | 6/1996 | Matsson et al. |
| 5,540,674 A | 7/1996 | Karas et al. |
| 5,540,890 A | 7/1996 | Clark et al. |
| 5,566,859 A | 10/1996 | Willis et al. |
| 5,588,547 A | 12/1996 | Derksen |
| 5,595,907 A | 1/1997 | Kayal et al. |
| 5,604,101 A | 2/1997 | Hanley et al. |

| | | |
|---|---|---|
| 5,611,792 A | 3/1997 | Gustafsson et al. |
| 5,623,942 A | 4/1997 | Pestes et al. |
| 5,627,071 A | 5/1997 | Triva et al. |
| 5,632,396 A | 5/1997 | Burns |
| 5,637,099 A | 6/1997 | Durdin et al. |
| 5,658,531 A | 8/1997 | Cope et al. |
| 5,681,742 A | 10/1997 | MersKelly et al. |
| 5,707,823 A | 1/1998 | Carr et al. |
| 5,738,233 A | 4/1998 | Burns |
| 5,738,920 A | 4/1998 | Knors |
| 5,753,186 A | 5/1998 | Hanley et al. |
| 5,779,074 A | 7/1998 | Burns |
| 5,786,227 A | 7/1998 | Charlton |
| 5,874,048 A | 2/1999 | Seto et al. |
| 5,876,926 A | 3/1999 | Beecham |
| 5,915,577 A | 6/1999 | Levine |
| 5,924,584 A | 7/1999 | Hellstrom et al. |
| 5,932,482 A | 8/1999 | Markelov |
| 5,935,523 A | 8/1999 | McCandless et al. |
| 5,945,070 A | 8/1999 | Kath et al. |
| 5,954,214 A | 9/1999 | Guezennec et al. |
| 5,957,822 A | 9/1999 | Bienhaus et al. |
| 5,958,778 A | 9/1999 | Kidd |
| 5,989,499 A | 11/1999 | Catanzariti et al. |
| 5,992,660 A | 11/1999 | Miura et al. |
| 6,001,087 A | 12/1999 | Zurcher |
| 6,006,931 A | 12/1999 | Sarstedt |
| 6,024,235 A | 2/2000 | Schwab |
| 6,030,582 A | 2/2000 | Levy |
| 6,054,099 A | 4/2000 | Levy |
| 6,056,135 A | 5/2000 | Widman |
| 6,068,150 A | 5/2000 | Mitchell et al. |
| 6,126,903 A | 10/2000 | Preston et al. |
| 6,145,688 A | 11/2000 | Smith |
| 6,170,693 B1 | 1/2001 | Goto |
| 6,234,335 B1 | 5/2001 | Gee et al. |
| 6,255,101 B1 | 7/2001 | Rousseau et al. |
| 6,274,087 B1 | 8/2001 | Preston et al. |
| 6,277,331 B1 | 8/2001 | Konrad |
| 6,286,698 B2 | 9/2001 | Hague et al. |
| 6,315,145 B1 | 11/2001 | Fask et al. |
| 6,361,744 B1 | 3/2002 | Levy |
| 6,375,022 B1 | 4/2002 | Zurcher et al. |
| D457,247 S | 5/2002 | Iheme et al. |
| 6,402,407 B1 | 6/2002 | Goldstein |
| 6,406,671 B1 | 6/2002 | DiCesare et al. |
| 6,426,046 B1 | 7/2002 | Cassells et al. |
| 6,464,105 B1 | 10/2002 | Rolle et al. |
| 6,475,774 B1 | 11/2002 | Gupta |
| 6,500,390 B1 | 12/2002 | Boulton et al. |
| 6,517,782 B1 | 2/2003 | Horner et al. |
| 6,517,783 B2 | 2/2003 | Horner et al. |
| 6,562,300 B2 | 5/2003 | Rosen et al. |
| 6,602,474 B1 | 8/2003 | Tajima |
| 6,607,685 B2 * | 8/2003 | Naritomi et al. ............ 264/250 |
| 6,617,170 B2 | 9/2003 | Augello et al. |
| 6,627,156 B1 | 9/2003 | Goodale et al. |
| 6,662,957 B2 | 12/2003 | Zurcher et al. |
| 6,716,396 B1 | 4/2004 | Anderson et al. |
| 6,723,289 B2 * | 4/2004 | Iheme et al. ............... 422/100 |
| 6,752,965 B2 | 6/2004 | Levy |
| 6,806,094 B2 | 10/2004 | Anderson et al. |
| 6,837,954 B2 | 1/2005 | Carano |
| 6,893,612 B2 * | 5/2005 | Kacian et al. .............. 422/100 |
| 6,943,035 B1 | 9/2005 | Davies et al. |
| 6,959,615 B2 | 11/2005 | Gamble |
| 6,994,699 B2 | 2/2006 | Houwaert et al. |
| 7,097,057 B2 | 8/2006 | Classens |
| 7,128,228 B2 | 10/2006 | Collins |
| 7,153,477 B2 | 12/2006 | DiCesare et al. |
| 7,188,734 B2 | 3/2007 | Konrad |
| 7,276,208 B2 | 10/2007 | Sevigny et al. |
| 7,276,383 B2 | 10/2007 | Iheme et al. |
| 7,282,182 B2 | 10/2007 | Dale et al. |
| 7,285,423 B2 | 10/2007 | Ulin |
| 7,294,308 B2 * | 11/2007 | Kacian et al. ................ 422/99 |
| 7,309,468 B2 | 12/2007 | Stevens et al. |
| 7,309,469 B2 | 12/2007 | Anderson et al. |
| 7,387,216 B1 | 6/2008 | Smith |
| 7,435,389 B2 | 10/2008 | Anderson et al. |
| 7,578,975 B2 | 8/2009 | DiCesare et al. |
| 7,691,332 B2 * | 4/2010 | Kacian et al. ................. 422/100 |
| 7,824,922 B2 | 11/2010 | Kacian et al. |
| 2001/0039058 A1 | 11/2001 | Iheme et al. |
| 2001/0041336 A1 * | 11/2001 | Anderson et al. ............... 435/6 |
| 2002/0029022 A1 | 3/2002 | Naritomi et al. |
| 2002/0131902 A1 | 9/2002 | Levy |
| 2002/0132367 A1 | 9/2002 | Miller et al. |
| 2003/0052074 A1 | 3/2003 | Chang et al. |
| 2003/0053938 A1 | 3/2003 | Szeles |
| 2004/0067169 A1 | 4/2004 | Krause |
| 2004/0076546 A1 | 4/2004 | Bissett |
| 2004/0091401 A1 | 5/2004 | Golabek et al. |
| 2004/0152205 A1 | 8/2004 | Anderson et al. |
| 2005/0059161 A1 | 3/2005 | Anderson et al. |
| 2005/0281713 A1 | 12/2005 | Hampsch et al. |
| 2006/0057738 A1 | 3/2006 | Hall |
| 2008/0072690 A1 | 3/2008 | Kacian et al. |
| 2009/0098567 A1 | 4/2009 | Kacian et al. |
| 2009/0208966 A1 | 8/2009 | Kacian et al. |
| 2011/0076727 A1 | 3/2011 | Kacian et al. |

FOREIGN PATENT DOCUMENTS

| | | |
|---|---|---|
| DE | 37 33 696 C1 | 3/1989 |
| DE | 199 38 078 A1 | 2/2001 |
| EP | 0 081 976 B1 | 6/1983 |
| EP | 0 115 480 A2 | 8/1984 |
| EP | 0 330 883 | 9/1989 |
| EP | 0454493 A2 | 10/1991 |
| EP | 0513901 A1 | 11/1992 |
| GB | 2 048 836 A | 12/1980 |
| JP | 7051253 A | 2/1995 |
| JP | 2594337 | 5/1995 |
| JP | 8103433 A | 4/1996 |
| WO | 9945360 A1 | 9/1999 |
| WO | 00/69389 A2 | 11/2000 |
| WO | WO00/69389 | 11/2000 |

OTHER PUBLICATIONS

Defendant Becton, Dickinson and Company's Supplemental Preliminary Invalidity Contentions, *Gen-Probe Incorporated v. Becton Dickinson and Company*, Civil Action No. 09 CV 2319, United States District Court for the Southern District of California, Aug. 2, 2010.
Proprietor's Observations Relating to Oppositions Filed in Respect of EP 1 795 263, European Patent Office, Sep. 2, 2010.
USPTO Notice of Allowance, U.S. Appl. No. 12/412,074, Sep. 22, 2010.
USPTO Office Action, U.S. Appl. No. 10/093,511, Oct. 27, 2004.
USPTO Notice of Allowance, U.S. Appl. No. 10/093,511, Jan. 31, 2005.
USPTO Office Action, U.S. Appl. No. 10/954,578, Apr. 4, 2007.
USPTO Notice of Allowance, U.S. Appl. No. 10/954,578, Oct. 2, 2007.
PCT Search Report, International Application No. PCT/US02/07266, Jul. 16, 2002.
APO Office Action, Australian Patent Application No. 2009200876, Jun. 3, 2009.
APO Office Action, Australian Patent Application No. 2002245655, Dec. 13, 2005.
APO Notice of Allowance, Australian Patent Application No. 2002245655, Jul. 26, 2006.
CIPO Office Action, Canadian Patent Application No. 2,643,398, May 5, 2009.
CIPO Office Action, Canadian Patent Application No. 2,442,176, May 15, 2007.
CIPO Office Action, Canadian Patent Application No. 2,442,176, Jan. 10, 2008.
CIPO Office Action, Canadian Patent Application No. 2,442,176, Mar. 10, 2008.
EPO Office Action, European Patent Application No. 02 713 827.0, Feb. 21, 2005.
EPO Search Report, European Patent Application No. 06 12 0851.8, May 15, 2007.

EPO Search Report, European Patent Application No. 08161326.7, Oct. 1, 2008.
EPO Rule 71(3) Communication, European Patent Application No. 08161326.7, Jul. 20, 2009.
APO Notice of Allowance, Australian Patent Application No. 2006235930, Feb. 26, 2009.
CIPO Notice of Allowance, Canadian Patent Application No. 2,442,176, Oct. 24, 2008.
EPO Rule 51(4) Communication, European Patent Application No. 02713827.0, Feb. 10, 2006.
EPO Rule 97(2) Communication, European Patent Application No. 02713827.0, Aug. 24, 2006.
EPO Rule 71(3) Communication, European Patent Application No. 06120851.8, Jul. 14, 2008.
Complaint, *Gen-Probe Incorporated v. Becton Dickinson and Company*, Civil Action No. 09 CV 2319, United States District Court for the Southern District of California, Oct. 19, 2009.
Answer and Counterclaim, *Gen-Probe Incorporated v. Becton Dickinson and Company*, Civil Action No. 09 CV 2319, United States District Court for the Southern District of California, Dec. 9, 2009.
Notice of Opposition to European Patent No. EP 1 795 263 by Becton, Dickinson and Company, European Patent Office, Nov. 26, 2009.
Brief in Support of Notice of Opposition to European Patent No. EP 1 795 263 by Becton, Dickinson and Company, European Patent Office, Nov. 18, 2009.
Notice of Opposition to European Patent No. EP 1 795 263 by Sandra Germann, European Patent Office, Nov. 26, 2009.
Brief in Support of Notice of Opposition to European Patent No. EP 1 795 263 by Sandra Germann, European Patent Office, Nov. 18, 2009.
English translation of Brief in Support of Notice of Opposition to European Patent No. EP 1 795 263 by Sandra Germann, European Patent Office, Nov. 18, 2009.
USPTO Office Action, U.S. Appl. No. 11/869,233, Apr. 7, 2009.
USPTO Office Action, U.S. Appl. No. 12/337,529, May 26, 2009.
USPTO Interview Summary, U.S. Appl. No. 12/337,529, Dec. 18, 2009.
CIPO Notice of Allowance, Canadian Patent Application No. 2,643,398, Jan. 11, 2010.
USPTO Office Action, U.S. Appl. No. 11/869,233, Jul. 2, 2008.
USPTO Interview Summary, U.S. Appl. No. 11/869,233, Sep. 2, 2009.
USPTO Interview Summary, U.S. Appl. No. 11/869,233, Sep. 9, 2009.
USPTO Notice of Allowance, U.S. Appl. No. 11/869,233, Dec. 16, 2009.
USPTO Office Action, U.S. Appl. No. 12/412,074, Jan. 21, 2010.
EPO Rule 97(1) Communication, European Patent Application No. 06120851.8, Jan. 22, 2009.
Notice of Opposition to European Patent No. EP 1 990 092 by Becton, Dickinson and Company, European Patent Office, Nov. 16, 2010.
Notice of Opposition to European Patent No. EP 1 990 092 by Roche Diagnostics Ltd., European Patent Office, Nov. 9, 2010.
Defendant Becton, Dickinson and Company's Patent L.R. 3.3 Amended Preliminary Invalidity Contentions, *Gen-Probe Incorporated v. Becton, Dickinson and Company*, Civil Action No. 09 CV 2319, United States District Court for the Southern District of California, Jun. 17, 2010.
Becton, Dickinson and Company's Opening Claim Construction Brief (Exhibits 5-7, 8-16, 17-27 and 48-54 only), *Gen-Probe Incorporated v. Becton, Dickinson and Company*, Civil Action No. 09 CV 2319, United States District Court for the Southern District of California, Nov. 24, 2010.
Notice of Lodgment of Exhibits in Support of Gen-Probe Incorporated's Responsive Claim Construction Brief, *Gen-Probe Incorporated v. Becton, Dickinson and Company*, Civil Action No. 09 CV 2319, United States District Court for the Southern District of California, Dec. 8, 2010.
Transcript of Claim Construction Hearing, *Gen-Probe Incorporated v. Becton, Dickinson and Company*, Civil Action No. 09 CV 2319, United States District Court for the Southern District of California, May 3, 2011.
Plaintiff Gen-Probe Incorporated's Opening Claim Construction Brief (Exhibits 6, 7, 22, 23, 26-32, 41 and 42 only), *Gen-Probe Incorporated v. Becton, Dickinson and Company*, Civil Action No. 09 CV 2319, United States District Court for the Southern District of California, Nov. 24, 2010.
Plaintiff Gen-Probe Incorporated's Responsive Claim Construction Brief (Public Version), *Gen-Probe Incorporated v. Becton, Dickinson and Company*, Civil Action No. 09 CV 2319, United States District Court for the Southern District of California, Dec. 8, 2010.
Joint Claim Construction Chart Pursuant to Patent Local Rule 4.2.A, *Gen-Probe Incorporated v. Becton, Dickinson and Company*, Civil Action No. 09 CV 2319, United States District Court for the Southern District of California, Oct. 8, 2010.
Joint Claim Construction Worksheet Pursuant to Patent Local Rule 4.2.B, *Gen-Probe Incorporated v. Becton, Dickinson and Company*, Civil Action No. 09 CV 2319, United States District Court for the Southern District of California, Oct. 8, 2010.
First Amended Complaint for Patent Infringement, *Gen-Probe Incorporated v. Benton, Dickinson and Company*, Civil Action No. 09 CV 2319, United States District Court for the Southern District of California, Apr. 22, 2011.
Answer and Counterclaim of Defendant Benton, Dickinson and Company to First Amended Complaint, *Gen-Probe Incorporated v. Becton, Dickinson and Company*, Civil Action No. 09 CV 2319, United States District Court for the Southern District of California, May 9, 2011.
Gen-Probe Incorporated's Reply to Counterclaim of Becton, Dickinson and Company to First Amended Complaint, *Gen-Probe Incorporated v. Becton, Dickinson and Company*, Civil Action No. 09 CV 2319, United States District Court for the Southern District of California, May 19, 2011.
Gen-Probe Incorporated's Responses and Objections to Defendant Becton, Dickinson and Company's First Set of Interrogatories (Redacted), *Gen-Probe Incorporated v. Becton, Dickinson and Company*, Civil Action No. 09 CV 2319, United States District Court for the Southern District of California, Jun. 4, 2010.
Gen-Probe Incorporated's Responses and Objections to Defendant Becton, Dickinson and Company's Third Set of Interrogatories (Redacted/Exhibit A Excluded), *Gen-Probe Incorporated v. Becton, Dickinson and Company*, Civil Action No. 09 CV 2319, United States District Court for the Southern District of California, Dec. 6, 2010.
Gen-Probe Incorporated's Amended Response and Objections to Defendant Becton, Dickinson and Company's Interrogatory No. 1, *Gen-Probe Incorporated v. Becton, Dickinson and Company*, Civil Action No. 09 CV 2319, United States District Court for the Southern District of California, Aug. 27, 2010.
Gen-Probe Incorporated's Amended Responses and Objections to Defendant Becton, Dickinson and Company's Interrogatory Nos. 2 and 3 (Redacted), *Gen-Probe Incorporated v. Becton, Dickinson and Company*, Civil Action No. 09 CV 2319, United States District Court for the Southern District of California, Nov. 8, 2010.
Proprietor's Observations Relating to Oppositions Filed in Respect of EP 1 990 092, European Patent Office, Apr. 21, 2011.
APO Notice of Allowance, Australian Patent Application No. 2009200876, Sep. 11, 2009.
USPTO Notice of Allowance, U.S. Appl. No. 10/093,511, Jan. 31, 2005.
USPTO Office Action, U.S. Appl. No. 12/959,016, Feb. 2, 2011.
USPTO Final Office Action, U.S. Appl. No. 12/959,016, Jul. 27, 2011.
USPTO Notice of Allowance, U.S. Appl. No. 12/959,016, Aug. 25, 2011.
Summons to Attend Oral Proceedings, European Patent No. EP 1 990 092, European Patent Office, Sep. 21, 2011.
Summons to Attend Oral Proceedings, European Patent No. EP 1 795 263, European Patent Office, Sep. 21, 2011.

\* cited by examiner

PENETRABLE CAP

CROSS-REFERENCE TO RELATED APPLICATIONS

This application is a continuation of U.S. application Ser. No. 11/869,233, filed Oct. 9, 2007, now U.S. Pat. No. 7,691,332, which is a continuation of U.S. application Ser. No. 10/954,578, filed Sep. 29, 2004, now U.S. Pat. No. 7,294,308, which is a divisional of U.S. application Ser. No. 10/093,511, filed Mar. 8, 2002, now U.S. Pat. No. 6,893,612, which claims the benefit of U.S. Provisional Application No. 60/274,493, filed Mar. 9, 2001, each of which applications is hereby incorporated by reference herein in its entirety.

FIELD OF THE INVENTION

The present invention relates to caps for use in combination with fluid-holding vessels, such as those designed to receive and retain biological specimens for clinical analysis, patient monitoring or diagnosis. In particular, the present invention relates to a cap which is penetrable by a fluid transfer device used to transfer fluids to or from a fluid-holding vessel, where the vessel and cap remain physically and sealably associated during a fluid transfer.

INCORPORATION BY REFERENCE

All references referred to herein are hereby incorporated by reference in their entirety. The incorporation of these references, standing alone, should not be construed as an assertion or admission by the inventors that any portion of the contents of all of these references, or any particular reference, is considered to be essential material for satisfying any national or regional statutory disclosure requirement for patent applications. Notwithstanding, the inventors reserve the right to rely upon any of such references, where appropriate, for providing material deemed essential to the claimed invention by an examining authority or court. No reference referred to herein is admitted to be prior art to the claimed invention.

BACKGROUND OF THE INVENTION

Collection devices are a type of cap and vessel combination commonly used for receiving and storing biological specimens for delivery to clinical laboratories, where the specimens may be analyzed to determine the existence or state of a particular condition or the presence of a particular infectious agent, such as a virus or bacterial microorganism. Types of biological specimens commonly collected and delivered to clinical laboratories for analysis include blood, urine, sputum, saliva, pus, mucous and cerebrospinal fluid. Since these specimen-types may contain pathogenic organisms, it is important to ensure that collection devices are constructed to be substantially leak-proof during transport from the site of collection to the site of analysis. This feature of collection devices is especially important when the clinical laboratory and the collection facility are remote from one another, increasing the likelihood that the collection device will be inverted or severely jostled during transport and potentially subjected to substantial temperature and pressure fluctuations.

To prevent specimen leakage, and possible contamination of the surrounding environment, collection device caps are typically designed to be screwed, snapped or otherwise frictionally fitted or welded onto the vessel component, thereby forming a substantially leak-proof seal between the cap and the vessel. In addition to preventing fluid specimen from leaking, a substantially leak-proof seal formed between the cap and the vessel components of a collection device may also aid in ameliorating exposure of the specimen to potentially contaminating influences from the immediate environment. This aspect of a leak-proof seal is important for preventing the introduction of contaminants into the collection device that could alter the qualitative or quantitative results of an assay.

While a leak-proof seal should prevent specimen seepage during transport, the actual removal of the cap from the vessel prior to specimen analysis presents another potential opportunity for contamination. When removing the cap, specimen which may have collected on the underside of the cap during transport could come into contact with a clinician, possibly exposing the clinician to a harmful pathogen present in the fluid sample. And if the specimen is proteinaceous or mucoid in nature, or if the transport medium contains detergents or surfactants, then a film or bubbles could form around the mouth of the vessel during transport which could burst when the cap is removed from the vessel, thereby disseminating specimen into the testing environment. Another risk associated with cap removal is the potential for creating a contaminating aerosol which may lead to false positives or exaggerated results in other specimens being simultaneously or subsequently assayed in the same general work area through cross-contamination. It is also possible that specimen residue from one collection device, which may have been inadvertently transferred to a gloved hand of a clinician, will come into contact with specimen from another collection device through routine or careless removal of caps and handling of the collection devices.

Concerns with cross-contamination are especially acute when the assay being performed involves nucleic acid detection and includes an amplification procedure such as the well known polymerase chain reaction (PCR), or a transcription-based amplification system such as transcription-mediated amplification (TMA). (A review of several amplification procedures currently in use, including PCR and TMA, is provided in HELEN H. LEE ET AL., NUCLEIC ACID AMPLIFICATION TECHNOLOGIES (1997).) Since amplification is intended to enhance assay sensitivity by increasing the quantity of targeted nucleic acid sequences present in a specimen, transferring even a minute amount of pathogen-bearing specimen from one vessel, or target nucleic acid from a positive control sample, to another vessel containing an otherwise negative specimen could result in a false-positive result.

To minimize the potential for creating contaminating specimen aerosols, and to limit direct contact between specimens and humans or the environment, it is desirable to have a collection device cap which can be penetrated by a fluid transfer device (e.g., a pipette tip which can be used with an air displacement pipette) while the cap remains physically and sealably associated with the vessel. The material and construction of the penetrable aspect of the cap should facilitate the venting of air displaced from the interior space of the collection device to ensure accurate fluid transfers and to prevent a rapid release of aerosols as the fluid transfer device is being inserted into or withdrawn from the collection device. And, because air is vented from the interior space of the collection device after the cap has been penetrated, it would be particularly helpful if means were included for minimizing aerosol release through the cap once it was penetrated by the fluid transfer device. Also, to limit the amount of potentially contaminating fluid present on the exterior of the fluid transfer device after it is has been withdrawn from the collection device, it would be advantageous if the cap also included means for wiping or absorbing fluid present on the outside of the fluid transfer device as it is being withdrawn from the collection device. To prevent damage to the fluid transfer device which could affect its ability to predictably and reliably dispense or draw fluids, and to facilitate its use in manual pipetting applications, the cap should also be designed to limit the forces necessary for the fluid transfer device to penetrate the cap. Ideally, the collection device could be used in both manual and automated formats and would be suitable for use with disposable pipette tips made of a plastic material.

Collection device caps which can be penetrated by a fluid transfer device will have other advantages, as well, including the time-savings resulting from clinicians not having to manually remove caps from vessels before retrieving sample aliquots from the collection devices for assaying. Another advantage of penetrable collection device caps would be the reduction in repetitive motion injuries suffered by clinicians from repeatedly unscrewing caps.

SUMMARY OF THE INVENTION

The present invention solves the potential contamination problems associated with conventional collection devices by providing a penetrable cap for use with a vessel component of a collection device which includes: (i) a closed side wall having an inner surface, an outer surface, a top surface and a bottom surface; (ii) attachment means for fixing the cap to an open end of the vessel in sealing engagement; (iii) a ledge which extends in a radial and inward direction from an inner surface of the side wall of the cap and has an end surface which defines an aperture sized to receive a fluid transfer device, where the inner surface of the side wall of the cap and a top surface of the ledge define a first bore; (iv) a frangible seal for preventing the passage of a fluid from an interior space of the vessel into the first bore when the cap is fixed to the vessel in sealing engagement, where the seal is affixed to either the top surface or a bottom surface of the ledge; (v) filtering means for impeding or preventing the release of an aerosol or bubbles from the interior space of the vessel to the atmosphere, where the filtering means is positioned substantially within the first bore; and (vi) retaining means for containing the filtering means within the first bore. (A "closed side wall" is one which lacks fully exposed end surfaces.) The retaining means is preferably affixed to a top wall of the cap. The side wall, the flange and the ledge of the cap are molded from a plastic material and preferably form a unitary piece.

In an alternative and preferred embodiment, the penetrable cap includes a skirt which depends from the bottom surface of the ledge, where an inner surface of the skirt defines a second bore having a diameter or width smaller than that of the first bore. The skirt may be included, inter alia, to further prevent a fluid from leaking from the interior of the vessel when the cap is fixed to the vessel in sealing engagement. (By "sealing engagement" is meant touching contact between solid surfaces which is intended to prevent or impede the passage of a fluid.) An outer surface of the skirt preferably includes a seal bead which is in frictional contact with an inner surface of the vessel. With this embodiment, the frangible seal may be affixed to either the top surface of the ledge or to a bottom surface of the skirt. The side wall, the flange, the ledge and the skirt of the cap of this embodiment are molded from a plastic material and preferably form a unitary piece.

In another embodiment of the present invention, the retaining means is a second frangible seal. The second frangible seal may comprise the same or a different material than the frangible seal affixed to the top or bottom surface of the ledge, or to the bottom surface of the skirt. Both seals are penetrable by a fluid transfer device with the application of moderate manual force and each seal preferably comprises a foil.

In still another embodiment of the present invention, the retaining means comprises a foil ring having a centrally located hole which is sized to receive a fluid transfer device and which is substantially axially aligned with the first bore and the second bore, if present. The diameter or width of this hole is smaller than the diameter or width of a filter contained within the first bore so that the foil ring can function to contain the filter within the cap. The foil ring of this embodiment may be affixed to the top wall of the cap by means of an adhesive or by means of a plastic liner which has been applied to the foil ring and which can be welded to the surface of the top wall of the cap.

In yet another embodiment of the present invention, the retaining means includes a plastic disc having a hole formed therein which is sized to receive a fluid transfer device and which is substantially axially aligned with the first bore and the second bore, if present. The retaining means of this embodiment functions to contain a filter within the first bore. The disc may be affixed to the top wall of the cap or the top wall may be adapted to include a seat for receiving the disc in, for example, a frictional or snap fit.

In a further embodiment, the retaining means comprises a removable seal which is designed to limit exposure of a filter to environmental contaminants and may include a tab for easy removal prior to penetrating the cap. Because this seal may be removed prior to penetration of the cap, it is not a requirement that this particular retaining means be comprised of a frangible material which can be pierced by a fluid transfer device applying moderate manual force. Since the removable seal can function to protect the filter against external contaminants during shipping, the removable seal may be applied, for example, to the fixed disc described above for retaining the filter within the first bore.

In still another embodiment, the cap is provided as part of a collection device which includes a vessel for containing fluids. When provided as a part of a collection device, the cap preferably includes the skirt feature described above, which is positioned adjacent to an inner surface of an open end of the vessel to impede the passage of a fluid from the interior space of the vessel to the environment outside of the collection device. Including a seal bead on an outer surface of the skirt further facilitates this objective by increasing the pressure which is exerted by the skirt on the inner surface of the vessel. The collection device may contain, for example, a dry powder, pellets of chemical reagents, buffers, stabilizers, or a transport medium for preserving a specimen while it is being shipped from a collection location to a site for analysis. The collection device may also be provided in packaged combination with a specimen retrieval device (e.g., a swab) for obtaining a specimen from a human, animal, water, environmental, industrial, food or other source. Instructional materials may additionally be included with the collection device which detail proper use of the collection device when obtaining or transporting a specimen or appropriate techniques for retrieving a fluid sample from the collection device at the site of analysis. When in packaged combination, the recited items are provided in the same container (e.g., a mail or delivery container for shipping), but do not need to be per se physically associated with one another in the container or combined in the same wrapper or vessel within the container.

In yet another embodiment, the cap can be used in a method for retrieving a fluid substance from the vessel component of a collection device with a plastic pipette tip for use with an air displacement pipette. When the cap is penetrated by the pipette tip, air passageways are formed between the pipette tip and the frangible seal or seals of the cap, thereby facilitating the venting of air from within the vessel. After fluid is removed from the collection device, at least some portion of the fluid sample may be exposed to amplification reagents and conditions permitting a targeted nucleic acid sequence which may be present in the fluid sample to be amplified. Various amplification procedures, and their associated reagents and conditions, are well known to those skilled in the art of nucleic acid diagnostics.

In still another embodiment, a method is provided for removing a fluid substance contained in a closed system comprising a cap and a fluid-holding vessel. In addition to the cap and vessel components, the phrase "closed system" is used herein to refer to a cap that is fixed to a vessel in sealing engagement to prevent the fluid contents of the system from escaping into the surrounding environment. The method includes penetrating first and second frangible seals affixed to the cap with a fluid transfer device, where the second seal is axially aligned below the first seal. Penetration of the first and second seals by the fluid transfer device results in the formation of air passageways between the seals and the fluid transfer device which aid in venting air from the interior space of the system. The fluid transfer device is preferably a plastic pipette tip for use with an air displacement pipette. In a preferred mode, the method further includes passing the fluid transfer device through a filter contained within the cap and interposed between the first and second seals.

Once fluid has been removed from the system in this method, some or all of the fluid sample may be exposed to amplification reagents and conditions permitting a targeted nucleic acid sequence which may be present in the fluid sample to be amplified. As noted above, a variety of amplification procedures are well known to those skilled in the art of nucleic acid diagnostics, and appropriate reagents and conditions for use with any of these amplification procedures could be determined without engaging in undue experimentation.

In yet a further embodiment of the present invention, a method is provided for depositing substances into the collection devices and other closed systems of the present invention by means of a substance transfer device capable of transporting fluids (e.g., specimen or assay reagents) or solids (e.g., particles, granules or powders). This embodiment of the present invention is particularly useful for diagnostic assays which can be performed in a single reaction vessel and where it is desirable to maintain the contents of the vessel in a substantially closed environment. The steps of this embodiment are similar to those of other preferred methods described herein, except that one or more substances would be deposited into the vessel component rather than retrieving a fluid sample contained therein.

The methods of the presently claimed invention may be performed manually or adapted for use with a semi-automated or fully automated instrument. Examples of instrument systems which could be readily adapted for use with the collection devices or other closed systems of the present invention include the DTS® 400 System (detection only) and the DTS® 1600 System (amplification and detection) (Gen-Probe Incorporated; San Diego, Calif.). See Acosta et al., "Assay Work Station," U.S. Pat. No. 6,254,826. Other fully automated instrument systems are disclosed by Ammann et al., "Automated Process for Isolating and Amplifying a Target Nucleic Acid Sequence," U.S. Pat. No. 6,335,166.

These and other features, aspects, and advantages of the present invention will become apparent to those skilled in the art after considering the following detailed description, appended claims and accompanying drawings.

DETAILED DESCRIPTION OF THE INVENTION

While the present invention may be embodied in a variety of forms, the following description and accompanying drawings are merely intended to disclose some of these forms as specific examples of the present invention. Accordingly, the present invention is not intended to be limited to the forms or embodiments so described and illustrated. Instead, the full scope of the present invention is set forth in the appended claims.

With reference to the figures, preferred caps 30A-E of the present invention are shown alone or in combination with a vessel 20 which can be used for receiving and storing fluid specimens for subsequent analysis, including analysis with nucleic acid-based assays or immunoassays diagnostic for a particular pathogenic organism. When the desired specimen is a biological fluid, the specimen can be, for example, blood, urine, saliva, sputum, mucous or other bodily secretion, pus, amniotic fluid, cerebrospinal fluid or seminal fluid. However, the present invention also contemplates materials other than these specific biological fluids, including, but not limited to, water, chemicals and assay reagents, as well as solid substances which can be dissolved in whole or in part in a fluid milieu (e.g., tissue specimens, stool, environmental samples, food products, powders, particles and granules). The vessel 20 is preferably capable of forming a substantially leak-proof seal with the cap 30A-E and can be of any shape or composition, provided the vessel is shaped to receive and retain the material of interest (e.g., fluid specimen or assay reagents). Where the vessel 20 contains a specimen to be assayed, it is important that the composition of the vessel be essentially inert so that it does not significantly interfere with the performance or results of an assay. A preferred vessel 20 is formed of polypropylene and has a generally cylindrical shape which measures approximately 13 mm×82 mm.

Figure 1:
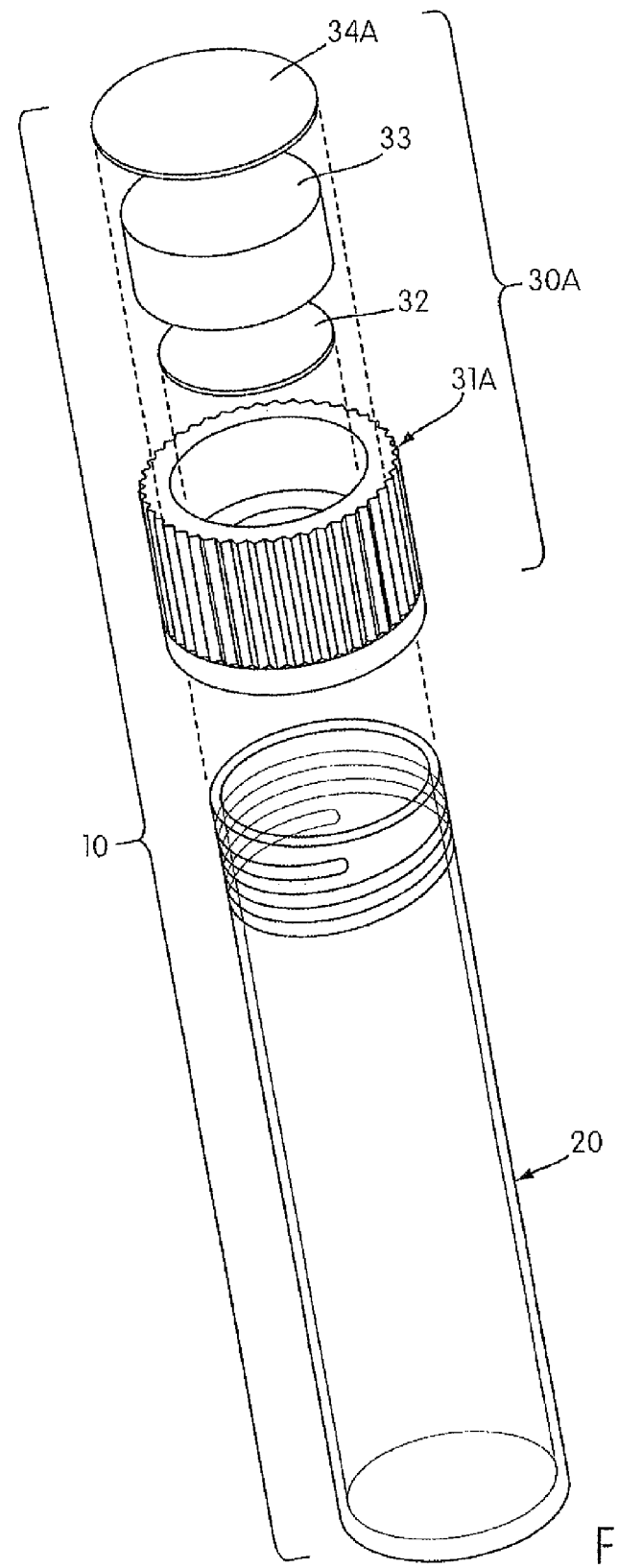
FIG. 1 is an exploded perspective view of the cap and vessel components of a preferred collection device of the present invention.
Figure 2:
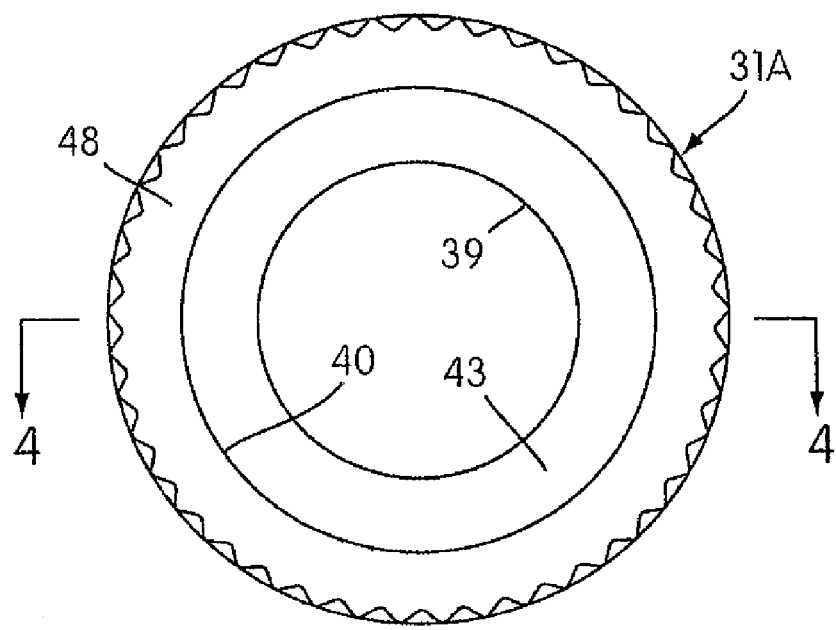
FIG. 2 is an enlarged top plan view of the core cap of FIG. 1.
Figure 3:
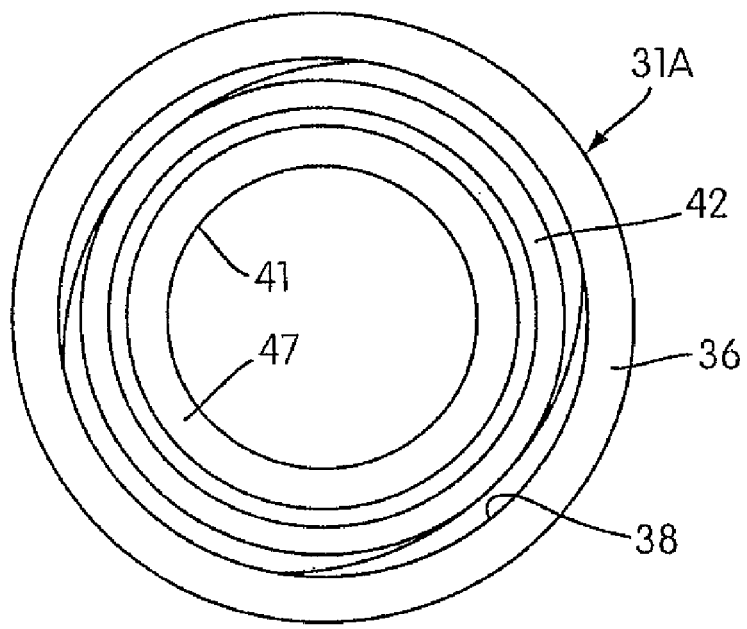
FIG. 3 is an enlarged bottom view of the core cap of FIG. 1.
Figure 4:
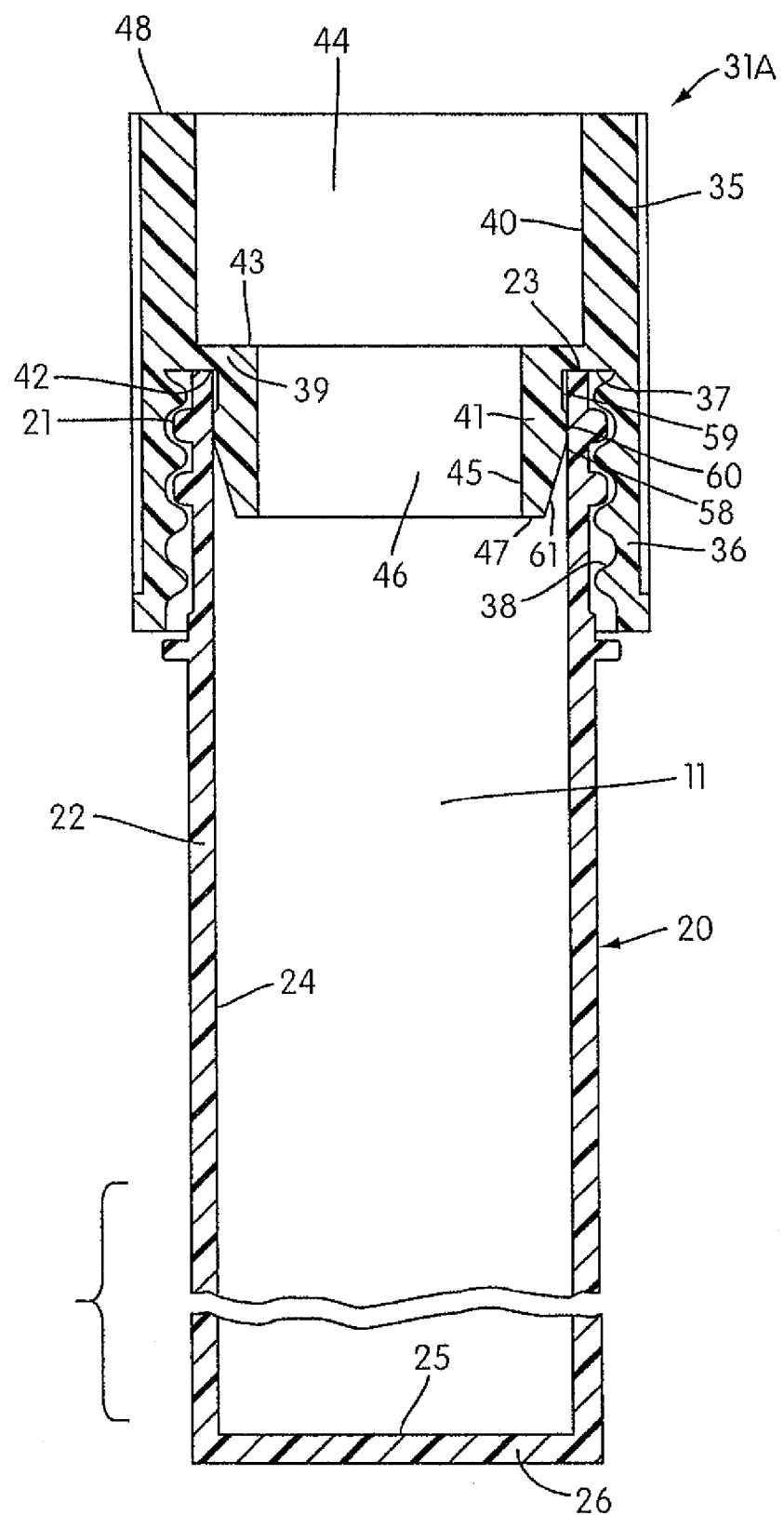
FIG. 4 is an enlarged partial section side view of the collection device of FIGS. 1-3 (showing core cap only), taken along the 4-4 line thereof.
Figure 6:
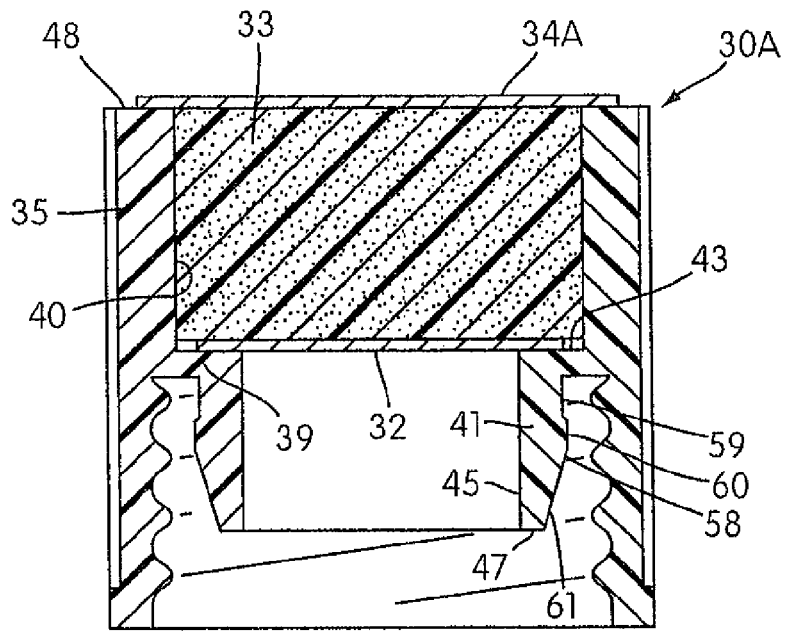
FIG. 6 is an enlarged section side view of the cap of FIG. 1.
Figure 7:
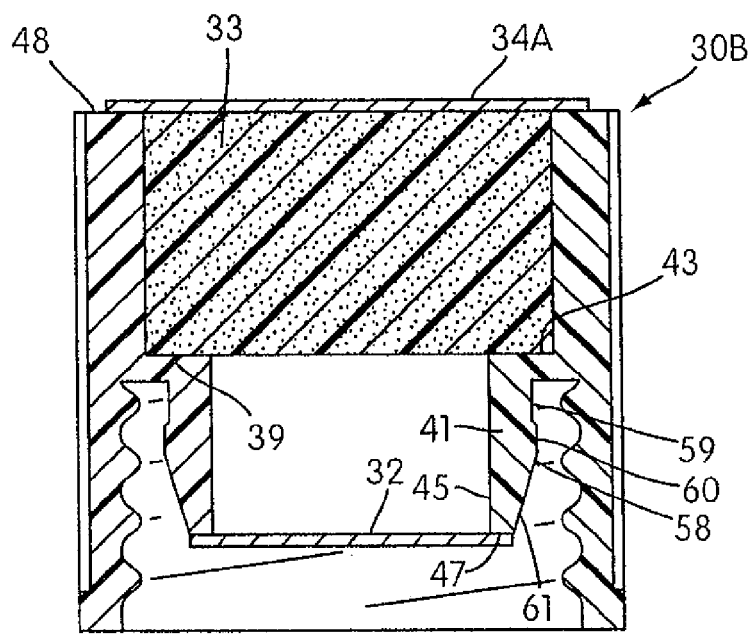
FIG. 7 is an enlarged section side view of another cap according to the present invention.

As illustrated in the figures, particularly preferred caps 30A-E of the present invention include an integrally molded core structure 31A (referred to herein as the "core cap") which comprises: (i) a generally cylindrical side wall 35; (ii) a flange 36 depending from a bottom surface 37 of the side wall and having an inner surface 38 adapted to grip an outer surface 21 of a generally cylindrical side wall 22 of an open-ended vessel 20; (iii) a ledge 39 extending radially inwardly from an inner surface 40 of the side wall 35 above the flange 36; and (iv) a generally cylindrical skirt 41 depending from a bottom surface 42 of the ledge in a substantially parallel orientation to the flange. The inner surface 40 of the side wall 35 and a top surface 43 of the ledge 39 define a first bore 44, as shown in FIG. 4, which is sized to receive a filter 33, as shown in FIGS. 6 and 7, that may be frictionally fitted or otherwise immobilized within the first bore. In a preferred embodiment, the ledge 39 aids in retaining the filter 33 within the first bore 44 during penetration of the cap 30A-E by a fluid transfer device. The ledge 39 can also function as a surface for affixing a frangible seal 32, as depicted in FIG. 6. An inner surface 45 of the skirt 41 beneath the top surface 43 of the ledge 39 defines a second bore 46 which is smaller in diameter than the first bore 44 and is sized to permit movement therethrough of a fluid transfer device. (The proximal portion of the skirt 41, where the top surface 43 of the ledge 39 meets the inner surface 45 of the skirt, may be chamfered to deflect a misaligned fluid transfer device during penetration of the cap 30A-E, provided sufficient surface area remains on the top surface of the ledge for affixing the frangible seal 32 thereto.) As shown in FIG. 7, the skirt 41 includes a bottom surface 47 which may serve as an alternate location for affixing the frangible seal 32.

Figure 5:
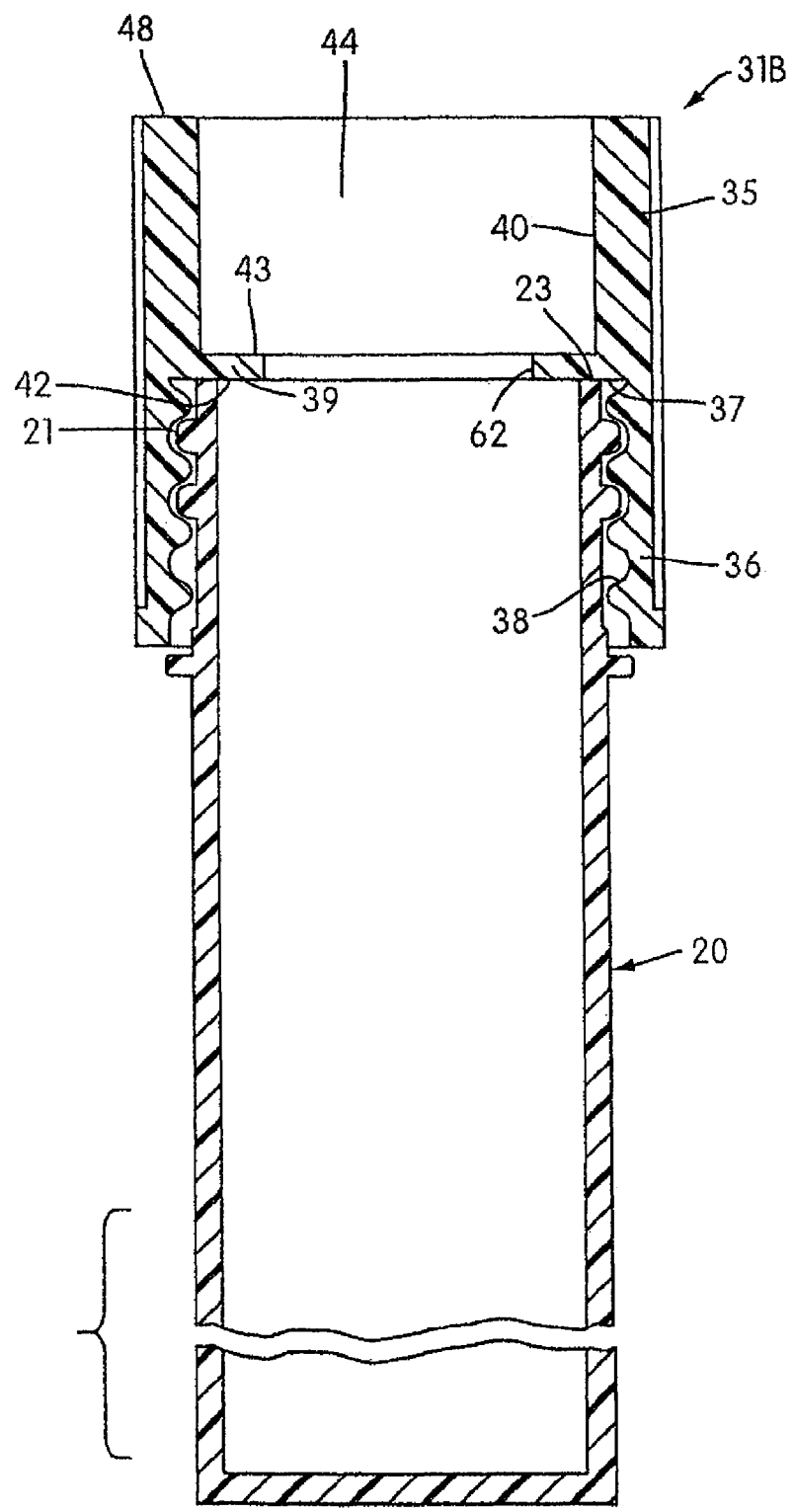
FIG. 5 is an enlarged partial section side view of another collection device according to the present invention.

In an alternative core cap 31B embodiment shown in FIG. 5, the skirt 41 is eliminated from the core cap 31A structure shown in FIG. 4. In this embodiment, the frangible seal 32 may be affixed to either the bottom surface 42 or the top surface 43 of the ledge 39. However, since the skirt 41 aids in preventing fluids from leaking from a collection device 10, it may be desirable to include an alternative fluid retainer for this core cap 31B embodiment, such as a neoprene O-ring (not shown) fitted between the bottom surface 37 of the side wall 35 and an annular top surface 23 of the vessel 20.

While the ledge 39 of the core cap 31B shown in FIG. 5 forms a flange structure having bottom and top surfaces 42, 43, this embodiment may be modified so that the inner surface 40 of the side wall 35 is extended radially inward until an end surface 62 of the ledge and the inner surface of the side wall are co-extensive. In this modified form of the core cap 31B (not shown), the ledge 39 is defined by the bottom surface 37 of the side wall 35, since the top surface 43 of the ledge is eliminated. Because the bore 44 of this embodiment is defined solely by the inner surface 40 of the side wall 35, the frangible seal 32 must be affixed to the bottom (or sole) surface 42 of the ledge 39.

A similar modification may be made to the preferred core cap 31A, whereby the inner surface 40 of the side wall 35 is extended radially inward until the inner surface 45 of the skirt 41 is co-extensive with the inner surface of the side wall. This modified form of the core cap 31A (not shown) eliminates the ledge 39, transforms the first and second bores 44, 46 into a single bore, and requires that the frangible seal 32 be affixed to the bottom surface 47 of the skirt 41. The disadvantage of these modified forms of the core caps 31A, 31B is that the alteration or elimination of the ledge 39 makes it is more difficult to maintain the filter 33 within the cap 30A-E when the cap is penetrated by a fluid transfer device. This problem may be overcome by adhering the filter 33 to the side wall 35 of the cap 30A-E, the frangible seal 32 or the retaining means 34A-C, for example.

The core cap 31A-B may be integrally molded from a number of different polymer and heteropolymer resins, including, but not limited to, polyolefins (e.g., high density polyethylene ("HDPE"), low density polyethylene ("LDPE"), a mixture of HDPE and LDPE, or polypropylene), polystyrene, high impact polystyrene and polycarbonate. A currently preferred material for forming the core cap 31A-B is an HDPE material sold under the tradename Alathon M5370 by GE Polymerland of Huntersville, N.C. Skilled artisans will readily appreciate that the range of acceptable cap resins will, in part, depend upon the nature of the resin used to form the vessel, since the properties of the resins used to form these two components will affect how well the cap 30A-E and vessel 20 components of a collection device 10 can form a leak proof seal and the ease with which the cap can be securely screwed onto the vessel. As with the vessel 20 component, the material of the core cap 31A-B should be essentially inert with respect to a fluid substance (including assay reagents) contained in the collection device 10 so that the material of the core cap does not significantly interfere with the performance or results of an assay.

The core cap 31A-B is injection molded as a unitary piece using procedures well-known to those skilled in the art of injection molding. After the core cap 31A-B has been formed and cured for a sufficient period of time, the following components are added to the core cap in the indicated manner and in any practicable order: (i) the frangible seal 32 to the top surface 43 of the ledge 39 of either core cap 31A-B, to the bottom surface 42 of the ledge of the alternative core cap 31B, or to the bottom surface 47 of the skirt 41 of the preferred core cap 31A; (ii) a filter 33 within the first bore 44; and (iii) a retainer 34A-D to the annular top wall 48.

The frangible seal 32 is included to provide a substantially leak-proof barrier between the fluid contents of a collection device 10 and the filter 33 contained in the first bore 44. For this reason, it is not critical whether the frangible seal 32 is affixed to a surface 42, 43 of the ledge 39 or to the bottom surface 47 of the skirt 41. According to a preferred embodiment of the present invention, the width of the annular top surface 43 of the ledge 39 is about 0.08 inches (2.03 mm), the thickness of the ledge (the distance between the top and bottom surfaces 43, 42 of the ledge) is about 0.038 inches (0.97 mm), the combined width of the annular bottom surface 42 of the ledge and the exposed bottom surface 37 of the side wall 35 is about 0.115 inches (2.92 mm), and the width of the annular bottom surface 47 of the skirt 41 is about 0.025 inches (0.635 mm). The dimensions of these features of the core cap 31A-B may vary, of course, provided sufficient surface area exists for affixing the frangible seal 32 to the core cap in a substantially leak-proof manner.

The frangible seal 32 may be made of a plastic film (e.g., thin monoaxially or biaxially oriented plastic film) or, preferably, of a foil (e.g., aluminum foil or other foil exhibiting low water vapor transmission), which can be affixed to a surface 42, 43 of the ledge 39 or to the bottom surface 47 of the skirt 41 by means well known to those skilled in the art, including adhesives. The frangible seal 32 is preferably not an integral component of the core cap 31A-B. If the frangible seal 32 comprises a foil, it may further include a compatibilizer, such as a thin veneer of plastic applied to one or both surfaces of the foil, which will promote a substantially leak-proof attachment of the frangible seal to a surface of the core cap 31A-B with the application of thermal energy. A heat sealer or heat induction sealer may be used to generate the requisite thermal energy. (To avoid the potentially deleterious effects of corrosion, it is recommended that all portions of a metallic frangible seal 32 which might become exposed to the fluid contents of a collection device 10 during routine handling be coated with a plastic liner.) A TOSS Machine heat sealer (Packworld USA; Nazareth, Pa.; Model No. RS242) is preferred for attaching the frangible seal 32 to a surface 42, 43 of the ledge 39 or to the bottom surface 47 of the skirt 41. Ultrasonic and radio frequency welding procedures known to those skilled in the art may also be used to affix the frangible seal 32 to the core cap 31A-B.

To further promote attachment of the frangible seal 32 to the core cap 31A-B, a surface 42, 43 of the ledge 39 or the bottom surface 47 of the skirt 41 may be modified during injection molding of the core cap to include an energy director, such as an annular ring or series of protuberances. By limiting contact between the frangible seal 32 and a plastic surface of the ledge 39 or skirt 41, an energy director allows the frangible seal 32 to be affixed to the ledge or skirt in less time and using less energy than would be required in its absence when an ultrasonic welding procedure is followed. This is because the smaller surface area of the protruding energy director melts and forms a weld with the plastic material of the frangible seal 32 more quickly than is possible with a flat, unmodified plastic surface. An energy director of the present invention is preferably a continuous surface ring which is triangular in cross-section.

Figure 8:
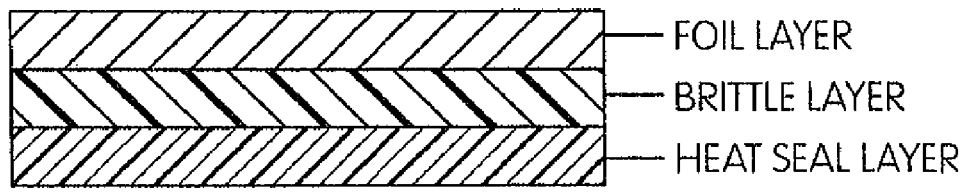
FIG. 8 is an enlarged section side view of a frangible seal according to the present invention.

In order to facilitate the venting of air from within a collection device 10, the frangible seal 32 is preferably constructed so that it tears when the seal is penetrated by a fluid transfer device, thereby forming air passageways 70 between the seal and the fluid transfer device, as described in detail infra. To achieve this tearing, the seal 32 preferably includes a brittle layer comprised of a hard plastic material, such as a polyester. (See CHARLES A. HARPER, HANDBOOK OF PLASTICS, ELASTOMERS, AND COMPOSITES §1.7.13 (1997 3d ed.) for a discussion of the properties of polyesters.) As shown in FIG. 8, the preferred seal 32 of the present invention is a co-laminate that includes a foil layer, a heat seal layer and an intervening brittle layer (Unipac; Ontario, Canada; Product No. SG-75M (excluding the pulp board and wax layers typically included with this product)). With this preferred seal 32, the foil layer is an aluminum foil having a thickness of about 0.001 inches (0.0254 mm), the heat seal layer is a polyethylene film having a thickness of about 0.0015 inches (0.0381 mm), and the brittle layer is a polyester having a thickness of about 0.0005 inches (0.0127 mm). Because this particular seal 32 design would have a metallic surface exposed to the contents of a collection device 10 after sealing—if applied to the bottom surface 42 of the ledge 39 or to the bottom surface 47 of the skirt 41—it is preferred that this seal 32 be applied to the top surface 43 of the ledge, as shown in FIGS. 6, 13, 15 and 17. In this way, the cap 30A, C, D and E of these embodiments will have no metallic surfaces exposed to the fluid contents of an associated vessel 20. While the diameter of the seal 32 will depend upon the dimensions of the cap 30A-E, the presently preferred seal has a diameter of about 0.5 inches (12.70 mm).

Figure 9:
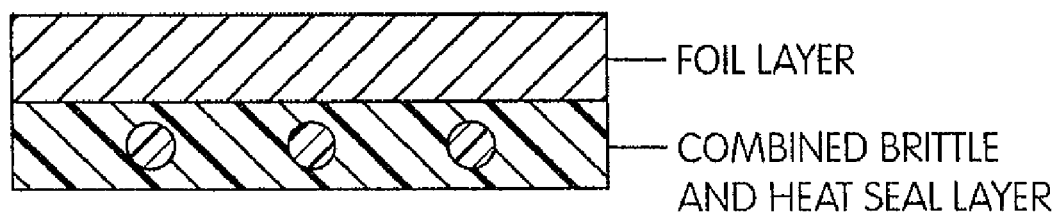
FIG. 9 is an enlarged section side view of another frangible seal according to the present invention.

An alternative frangible seal 32 embodiment is depicted in FIG. 9, which shows a top foil layer with a lower combined brittle/heat seal layer comprised of an epoxy resin. The epoxy resin is selected for its mechanical strength, which will promote formation of the desired air passageways 70 discussed above when the material is penetrated by a fluid transfer device. And, so that this seal 32 can be affixed to a plastic surface using a commonly practiced thermoplastic welding procedure, the epoxy layer further includes a compatibilizer dispersed within the epoxy resin, as shown in FIG. 9. A preferred compatibilizer of this seal 32 embodiment is a polyethylene.

As illustrated in the figures, the filter 33 is positioned within the first bore 44 above the ledge 39 and is incorporated to retard or block the movement of an escaping aerosol or bubbles after the seal has been pierced by a fluid transfer device. The filter 33 can also be constructed to perform a wiping action on the outside of a fluid transfer device as the fluid transfer device is being removed from a collection device 10. In a preferred mode, the filter 33 functions to draw fluids away from the outside of a fluid transfer device by means of capillary action. As used herein, however, the term "filter" refers generally to a material which performs a wiping function to remove fluids present on the outside of a fluid transfer device and/or an absorbing function to hold or otherwise sequester fluids removed from the outside of a fluid transfer device. For reasons discussed below, the filters 33 of the present invention are composed of a material or combination of materials having pores or interstices which admit the passage of a gas. Examples of filter 33 materials which may be used with the cap 30A-E of the present invention include, but are not limited to, pile fabrics, sponges, foams (with or without a surface skin), felts, sliver knits, a GORE-TEX® fabric, a fabric containing a LYCRA® fiber, and other materials and blends, both natural and synthetic. These materials may also be mechanically or chemically treated to further improve the intended functions of the filter 33. For example, napping may be used to increase the surface area and, therefore, the fluid holding capacity of a filter 33. The material of the filter 33 may also be pre-treated with a wetting agent, such as a surfactant, to lower the surface tension of a fluid present on an outer surface of a fluid transfer device. An acrylic binder might be used, for example, to actually bind the wetting agent to the filter 33 material. Additionally, the filter 33 may include a super-absorbent polymer, (see, e.g., Sackmann et al., "Pre-Formed Super Absorbers with High Swelling Capacity," U.S. Pat. No. 6,156,848), to prevent a fluid from escaping from a penetrated collection device 10.

To limit the unobstructed passage of air from within a collection device 10 to the environment, the filter 33 is preferably made of a resilient material whose original shape is restored, or substantially restored, as a fluid transfer device is being removed from the collection device. This characteristic of the filter 33 is especially important when the fluid transfer device has a non-uniform diameter, as is the case with most pipette tips used with standard air displacement pipettes. Thus, materials such as pile fabric, sponges, foams, and fabrics containing LYCRA® fibers are preferred because they tend to quickly restore their original shape after exposure to compressive forces. Pile fabric is a particularly preferred filter 33. An example of a preferred pile fabric is an acrylic material having a thickness of about 0.375 inches (9.53 mm) which is available from Roller Fabrics of Milwaukee, Wis. as Part No. ASW112. Examples of other acceptable pile fabrics include those made of acrylic and polyester materials and which range in size from about 0.25 inches (6.35 mm) to about 0.3125 inches (7.94 mm). Such pile fabrics are available from Mount Vernon Mills, Inc. of LaFrance, S.C. as Part Nos.

0446, 0439 and 0433. The filter 33 material is preferably inert with respect to a fluid substance contained within the vessel 20.

Because the filter 33 is intended to remove fluid from the exterior of a fluid transfer device and to capture fluid in the form of an aerosol or bubbles, it is best if the material and dimensions of the filter material are chosen so that the filter does not become saturated with fluid during use. If the filter 33 does become saturated, fluid may not be adequately wiped from the exterior of the fluid transfer device and bubbles may be produced as the fluid transfer device passes through the filter or as air is displaced from within the collection device 10. Thus, it is important to adapt the size and adsorptive properties of the filter 33 in order to achieve adequate wiping and aerosol or bubble containment. Considerations when selecting a filter 33 will include the cap configuration, the shape and size of the fluid transfer device and the nature and amount of fluid substance contained in the vessel 20, especially in view of the number of anticipated fluid transfers for a given collection device 10. As the amount of fluid a filter 33 is likely to be exposed to increases, the volume of the filter material or its absorptive properties may need to be adjusted so that the filter does not become saturated during use.

It is also important that the filter 33 be constructed and arranged in the cap 30A-E so that the flow of air out of the collection device 10 remains relatively unimpeded as the cap is being penetrated by a fluid transfer device. In other words, the material of the filter 33 and its arrangement within the cap 30A-E should facilitate the venting of air displaced from within the collection device 10. Of course, this venting property of the filter 33 needs to be balanced with the requirement that the filter material have sufficient density to trap an escaping aerosol or bubbles. Consequently, those skilled in the art will appreciate the need to select or design filter 33 materials having matrices that are capable of trapping an aerosol or bubbles, while simultaneously permitting air to be vented from within the collection device 10 once the underlying seal 32 has been pierced by a fluid transfer device.

As the figures show, the filter 33 is preferably sized to fit within the first bore 44 beneath the horizontal plane of the annular top wall 48. In a preferred cap 30A-E of the present invention, the filter 33 also rests substantially or completely above the ledge 39, even though the seal 32 may be affixed to the bottom surface 47 of the skirt 41, as illustrated in FIG. 7. To better ensure that the filter 33 is not substantially moved from its position within the first bore 44 by frictional contact with a fluid transfer device penetrating or being removed from the cap 30A-E, the filter may be bound to the top surface 43 of the ledge 39 or to the inner surface 40 of the side wall 35 using an inert adhesive. Notwithstanding, the filter 33 is preferably a pile fabric which is snugly fitted in the first bore 44 and retained there by means of the seal 32 and the retainer 34A-D, without the use of an adhesive. In preferred cap 30A-E embodiments, the first bore 44 is about 0.50 inches (12.70 mm) in diameter and has a height of about 0.31 inches (7.87 mm).

Figure 10:
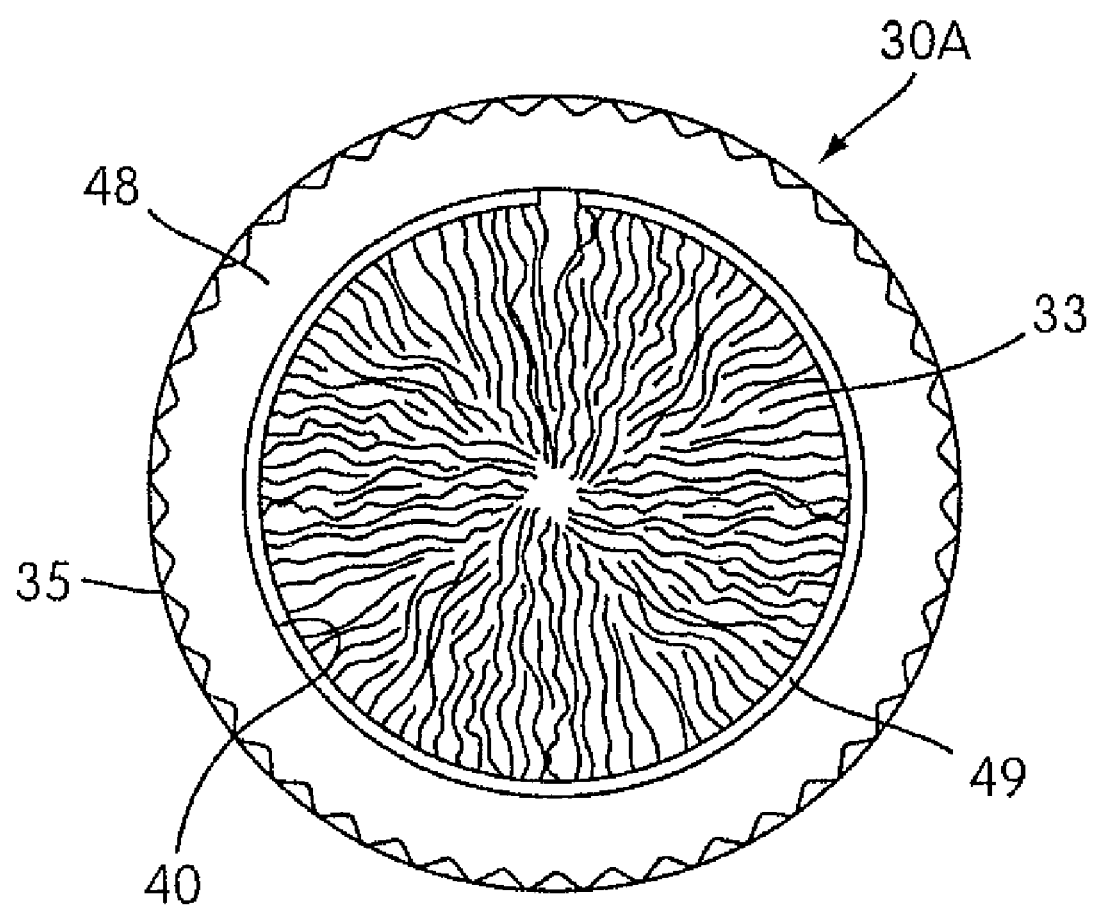
FIG. 10 is an enlarged top plan view of the core cap and filter of FIG. 1.

The material and configuration of the filter 33 should be such that it creates minimal frictional interference with a fluid transfer device as it is being inserted into or withdrawn from the collection device 10. In the case of a sponge or foam, for example, this may require boring a hole or creating one or more slits in the center of the filter 33 (not shown) which are sized to minimize frictional interference between the filter and a fluid transfer device, while at the same time providing enough interference so that aerosol or bubble transmission is limited and the wiping action is performed by the filter material. If a pile fabric is employed as the filter 33, the pile fabric is preferably arranged in the manner shown in FIG. 10, such that the free ends of individual fibers (shown as squiggles, but not specifically identified with a reference number) are oriented radially inwardly toward the longitudinal axis 80 of the cap 30A-E and away from the pile fabric backing 49 which is in touching or fixed contact with the inner surface 40 of the side wall 35. When rolling the pile fabric for insertion into the first bore 44, care should be taken not to wind the pile fabric so tightly that it will create excessive frictional interference with a fluid transfer device penetrating the cap 30A-E, thereby substantially impeding movement of the fluid transfer device. A particularly preferred pile fabric is available from Mount Vernon Mills, Inc. as Part No. 0446, which has a thickness of about 0.25 inches (6.35 mm) and is cut to have a length of about 1.44 inches (36.58 mm) and a width of about 0.25 inches (6.35 mm).

To immobilize the filter 33 within the first bore 44, the caps 30A-E of the present invention include a retainer 34A-D positioned above the filter, preferably on the annular top wall 48. In a preferred embodiment shown in FIGS. 6 and 7, the retainer 34A is a solid, generally circular frangible seal which may be of the same or a different material than the frangible seal 32 positioned beneath the filter 33. Preferably, the retainer 34A includes the same materials as the preferred seal 32 described above, which comprises an aluminum foil layer, a polyester brittle layer, and a polyethylene heat seal layer (Unipac; Ontario, Canada; Product No. SG-75M (excluding the pulp board and wax layers typically included with this product)). This retainer 34A can be applied to the annular top wall 48 with a heat sealer or heat induction sealer in the same manner that the seal 32 is applied to a surface 42, 43 of the ledge 39 or to the bottom surface 47 of the skirt 41. Like the preferred seal 32, the preferred retainer 34A has a foil layer thickness of about 0.001 inches (0.0254 mm), a brittle layer thickness of about 0.0005 inches (0.0127 mm), and a heat seal layer thickness of about 0.0015 inches (0.0381 mm). The diameter of the preferred retainer is about 0.625 inches (15.88 mm). Of course, the diameter of this preferred retainer 34A may vary and will depend upon the dimensions of the annular top wall 48.

Figure 11:
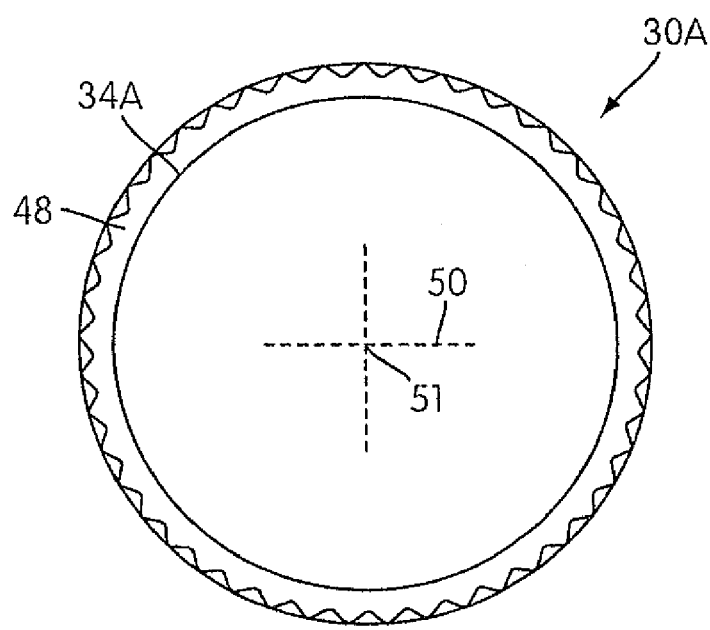
FIG. 11 is a top plan view of the cap of FIGS. 6 and 7 showing perforations in the frangible seal.

As illustrated in FIG. 11, the retainer 34A may be adapted to facilitate penetration by including one or more series of perforations 50 which extend radially outwardly from a center point 51 of the retainer. The center point 51 of these radiating perforations 50 is preferably positioned to coincide with the expected entry point of a fluid transfer device. Also contemplated by the present invention are other types of adaptations that would reduce the tensile strength of the retainer 34A, including creases, score lines or other mechanical impressions applied to the material of the retainer. The same adaptations may also be made to the seal 32, provided the seal will continue to exhibit low water vapor transmission characteristics after the collection device 10 is exposed to normal shipping and storage conditions.

Besides providing a means for keeping the filter 33 fixed within the first bore 44 prior to and during a fluid transfer, a seal retainer 34A can protect the underlying filter from external contaminants prior to penetration of the cap 30A. Moreover, a cap 30A designed to completely seal the filter 33 within the first bore 44 may be sterilized prior to use by, for example, gamma irradiation. Additionally, the retainer 34 of such a cap 30A could be wiped with a disinfectant or the entire collection device 10 could be irradiated with ultraviolet light prior to penetration to facilitate a sterile fluid transfer.

Figure 12:
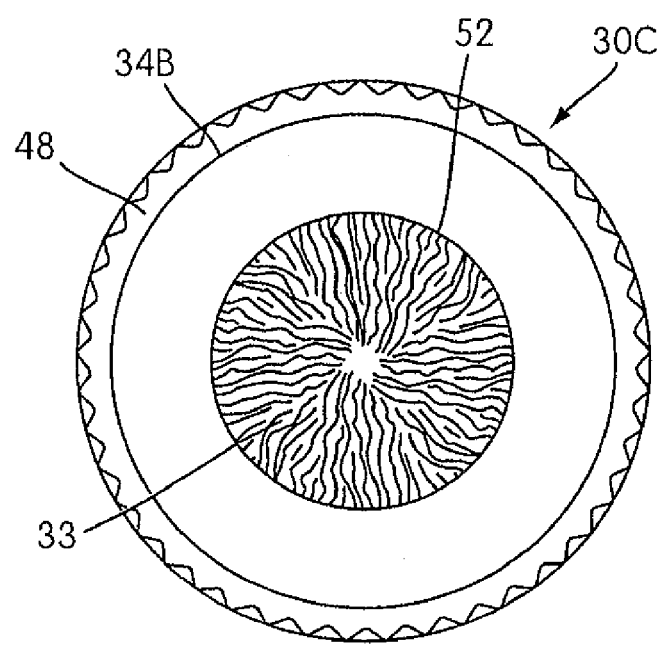
FIG. 12 is an enlarged top plan view of a further cap according to the present invention.

In those instances where the potential presence of contaminants on the filter would not be of significant concern, however, the retainer may comprise a foil ring, for example, which includes a centrally located hole which is sized to receive a fluid transfer device. As illustrated in FIG. 12, a cap 30C having a retainer 34B with a centrally located hole 52 could aid in retaining the filter 33 within the first bore 44, while at the same time limiting the number of surfaces that a fluid transfer device would have to pierce in order to fully penetrate the cap. To retain the filter 33 within the first bore 44, the diameter of the hole 52 would have to be smaller than the diameter of the filter when the hole and the filter are substantially axially aligned.

Figure 13:
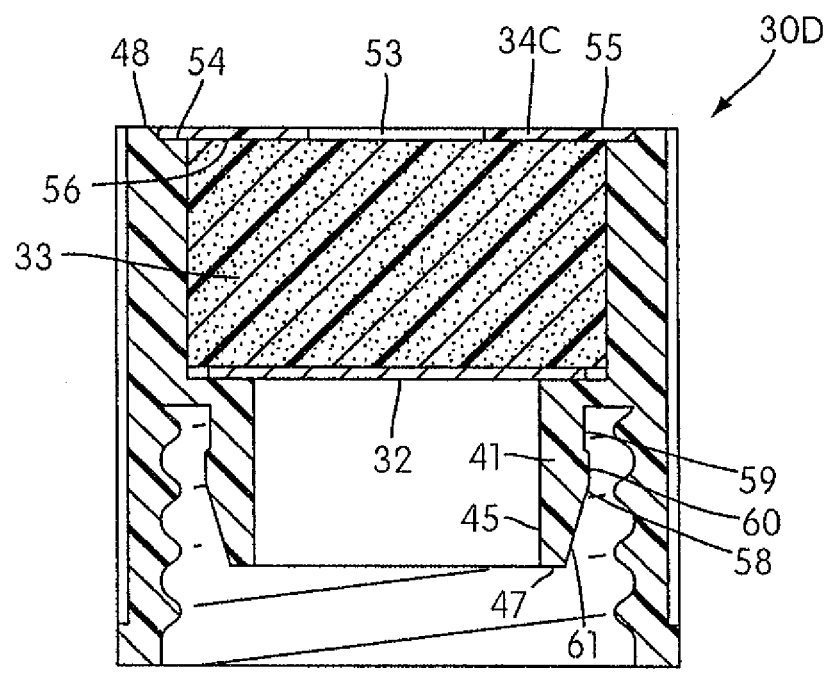
FIG. 13 is an enlarged section side view of yet another cap according to the present invention.
Figure 14:
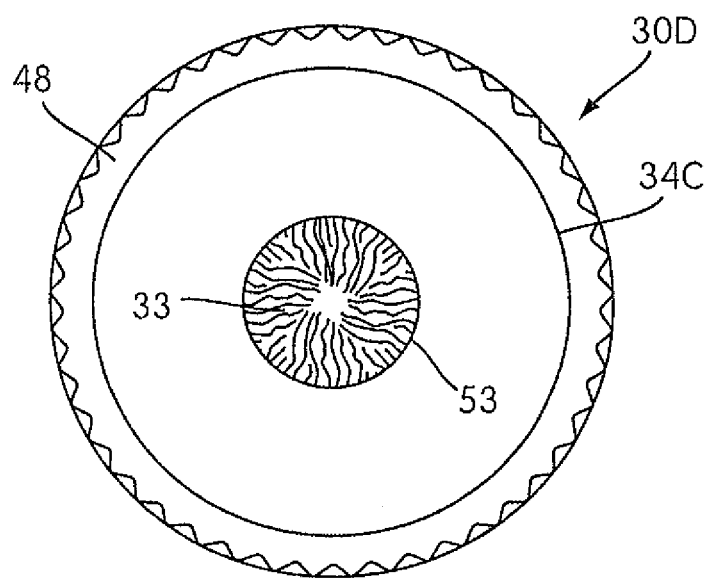
FIG. 14 is a top plan view of the cap of FIG. 13.
Figure 15:
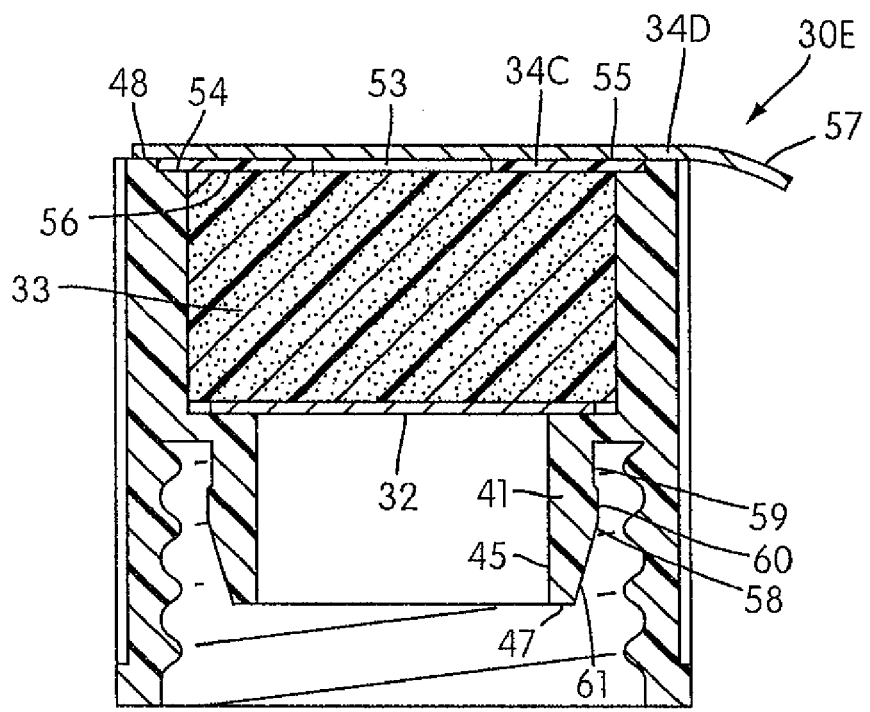
FIG. 15 is an enlarged section side view of still another cap according to the present invention.
Figure 16:
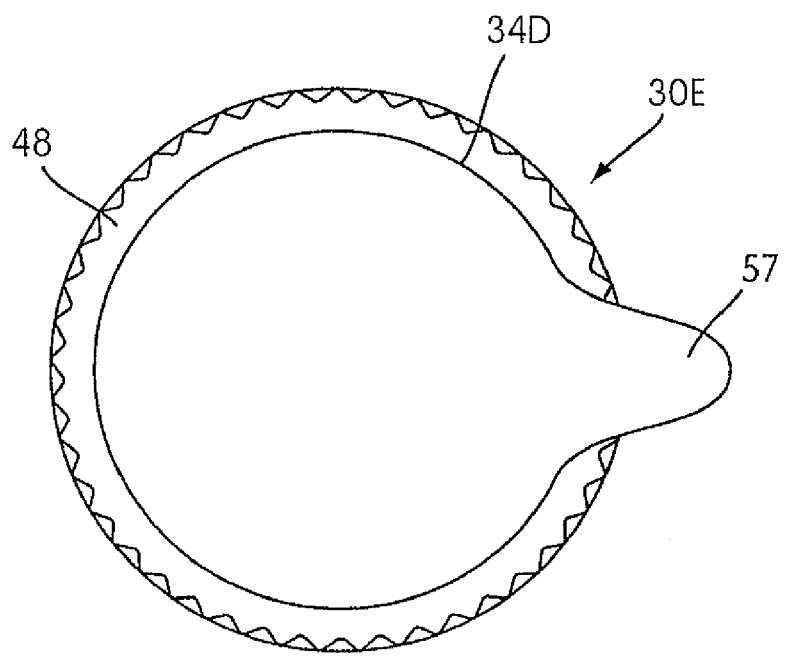
FIG. 16 is a top plan view of the cap of FIG. 15.

Another cap 30D embodiment is illustrated in FIGS. 13 and 14. The retainer 34C of this cap 30D is a plastic disc which includes a centrally located hole 53 sized to receive a fluid transfer device. The disc 34C may be affixed to the annular top wall 48 by means of an adhesive or welded by heat, ultrasound or other appropriate welding method known to skilled artisans. Alternatively, the annular top wall 48 may be modified to include a seat 54 which is sized to receive the disc 34C in, for example, a frictional or snap fit. While this particular cap 30D embodiment does not provide the filter 33 with a completely sealed environment, the disc retainer 34C can nevertheless function to contain the filter 33 within the first bore 44 during transport of the collection device 10, as well as during a fluid transfer. If it is important to protect the filter 33 from potential contaminants prior to use, then the cap 30D of this embodiment could further include a seal, such as the frangible seal 34A described supra, affixed to a top 55 or a bottom surface 56 of the disc 34C so that the hole 53 is fully and sealably covered. As illustrated in FIGS. 15 and 16, one such seal 34D could include a tab 57 for easy removal. With this design, the seal 34D of a cap 30E could be removed just before penetration of the cap with a fluid transfer device, allowing the filter 33 to be protected from external contaminants immediately prior to use. An advantage of this cap 30E over, for example, the cap 30A-B embodiments shown in FIGS. 6 and 7 is that penetration of the cap will require less force since there is only one seal 32, as opposed to the two seals 32, 34A of those embodiments, that the fluid transfer device needs to pierce.

Figure 17:
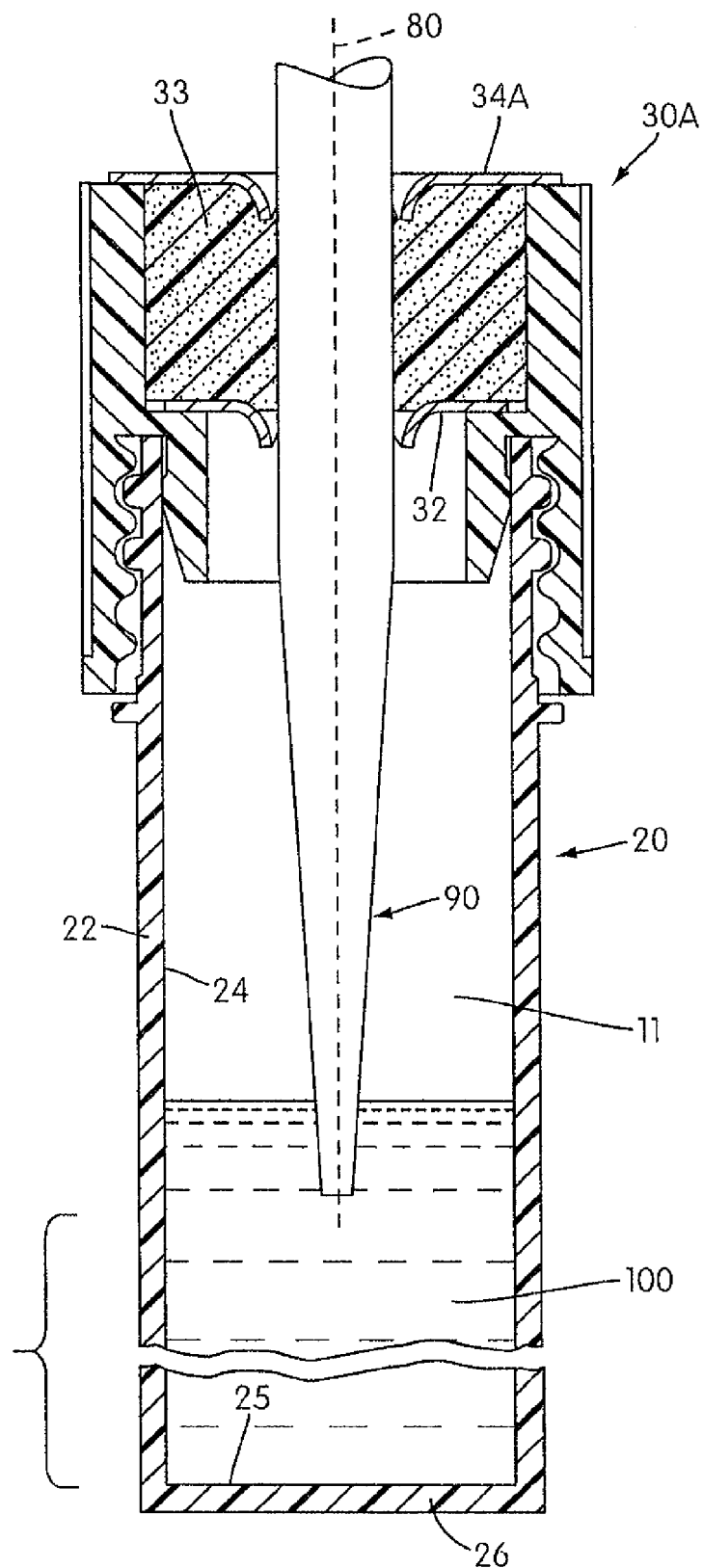
FIG. 17 is a partial section side view of the collection device of FIG. 1, after it has been penetrated by a fluid transfer device.
Figure 18:
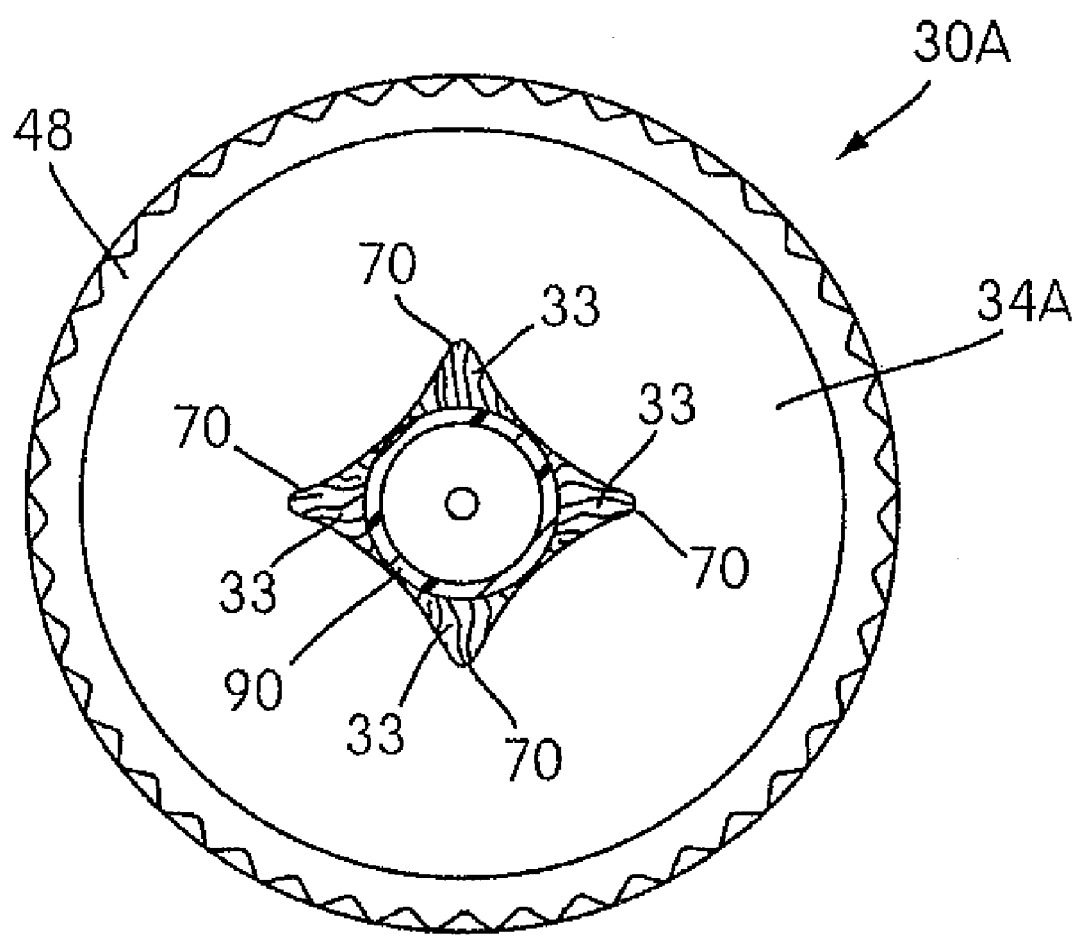
FIG. 18 is a top plan view of the cap and fluid transfer device of FIG. 17.

When a cap 30A-E of the present invention is pierced by a fluid transfer device 90 which is used to retrieve at least a portion of a fluid sample 100 contained in a collection device 10, as shown in FIG. 17, one or more tears are preferably formed in the frangible seal 32 and, if comprised of a frangible seal, the retainer 34A. As FIG. 18 illustrates, these tears in the frangible seal form air passageways 70 which facilitate the venting of air displaced from within a collection device 10 as the fluid transfer device 90 enters the interior space 11 (defined as the space below the cap 30A-E and within inner surfaces 24, 25 of the side wall 22 and a bottom wall 26 of the vessel 20) of the collection device 10. By providing means for venting air displaced from within a collection device 10, the volume accuracy of fluid transfers (e.g., pipetting) will likely be improved. While a variety of fluid transfer devices can be used with the present invention, including hollow metal needles and conventional plastic pipette tips having beveled or flat tips, a preferred fluid transfer device is the Genesis series 1000 µl Tecan-Tip (with filter), available from Eppendorf-Netherler-Hinz GmbH of Hamburg, Germany as Part No. 612-513. Fluid transfer devices of the present invention are preferably able to penetrate the frangible seal 32 with the application of less than about 3 pounds force (13.34 N), more preferably less than about 2 pounds force (8.90 N), even more preferably less than about 1 pound force (4.45 N), and most preferably less than about 0.5 pounds force (2.22 N).

The insertion force, which is the total or additive force required to pierce all penetrable surfaces of a cap 30A-E according to the present invention (i.e., the frangible seal 32, the filter 33 and, optionally, the retainer 34A) with a fluid transfer device, is preferably less than about 8 pounds force (35.59 N), more preferably less than about 6.5 pounds force (28.91 N), even more preferably less than about 5 pounds force (22.24 N), and most preferably less than about 4.5 pounds force (20.02 N). The withdrawal force, which is the force required to completely withdraw a fluid transfer device from the collection device 10 after the cap 30A-E has been completely penetrated, is preferably less than about 4 pounds force (17.79 N), more preferably less than about 3 pounds force (13.34 N), even more preferably less than about 2 pounds force (8.90 N), and most preferably less than about 1 pound force (4.45 N). The forces exerted on the fluid transfer device as it is being withdrawn from a collection device 10 should be minimized to avoid stripping the fluid transfer device from, for example, the mounting probe of a vacuum pipette. Insertion and withdrawal forces can be determined using conventional force measurement instruments, such as a motorized test stand (Model No. TCD 200) and digital force gauge (Model No. DFGS-50) available from John Chatillon & Sons, Inc, of Greensboro, N.C.

A cap 30A-E according to the present invention is generally provided in combination with a fluid-holding vessel 20 as components of a collection device 10. The cap 30A-E and vessel 20 of the collection device 10 can be joined by means of mated threads which allow the cap to be screwed, snapped or otherwise frictionally fitted onto an outer surface 21 of the side wall 22 at the open end of the vessel. When the cap 30A-E is frictionally fitted onto the vessel 20, the bottom surface 37 of the side wall 35 of the cap is preferably in contact with the annular top surface 23 of the vessel to provide an interference fit, thereby facilitating the essentially leak-proof seal discussed above. The cap 30A-E can be modified to further improve resistance of the collection device 10 to leaking by providing an annular seal bead 58 to an outer surface 59 of the skirt 41, as shown in FIG. 4. If the seal bead 58 is included, it should be sized so that it will be in frictional contact with the inner surface 24 of the side wall 22 of the vessel 20 but will not substantially interfere with joining of the cap 30A-E and vessel. The annular center 60 of the preferred seal bead 58 is about 0.071 inches (1.80 mm) from the bottom surface 37 of the side wall 35 and extends radially outwardly about 0.0085 inches (0.216 mm) from the outer surface 59 of the skirt 41, where the thickness of the skirt 41 above the seal bead 58 is about 0.052 inches (1.32 mm). The skirt 41 preferably includes a beveled base 61 below the seal bead 58 to facilitate joining of the cap 30A-E and vessel 20. In a preferred embodiment, the skirt 41 extends downward a vertical distance of about 0.109 inches (2.77 mm) from the annular center 60 of the seal bead 58 to the bottom surface 47 of the skirt and uniformly decreases in thickness from about 0.0605 inches (1.54 mm) to about 0.025 inches (0.635 mm) between the annular center of the seal bead and the bottom surface of the skirt. The second bore 46 of this preferred embodiment has a diameter of about 0.340 inches (8.64 mm) and a height of about 0.218 inches (5.54 mm).

When provided as a component of a kit, the collection device 10 of the present invention preferably includes a specimen retrieval device for obtaining a sample to be analyzed, where the specimen retrieval device has preferably been sized to fit within the interior space 11 of the collection device after the cap 30A-E and vessel 20 have been joined. A preferred specimen retrieval device is a swab, such as the swab disclosed by Pestes et al., "Cell Collection Swab," U.S. Pat. No. 5,623,942. This particular swab is preferred because it is manufactured to include a score line which is positioned on the stem of the swab, allowing the swab to be manually snapped in two after a specimen has been obtained, leaving the lower, specimen-bearing portion of the swab entirely inside the vessel 20 component of the collection device 10. When the specimen is being transported to a clinical laboratory, the collection device 10 also preferably includes a transport medium for preserving the sample prior to analysis. Transport mediums are well known in the art and will vary depending upon the sample type and whether cell lysis prior to analysis is necessary.

Additionally, a kit according to the present invention may include instructions recorded in a tangible form (e.g., contained on paper or an electronic medium) which explain how the components of the collection device 10 are to be manipulated when obtaining a fluid sample or how the cap 30A-E is to be secured onto the vessel 20 prior to transporting the collection device to a clinical laboratory. Alternatively, or in addition to, the instructions may detail proper pipetting techniques for retrieving at least a portion of the sample from the collection device 10 prior to analysis. These instructions may include information about types of fluid transfer devices that can be used to penetrate the cap 30A-E, positioning of a fluid transfer device for penetrating the cap and/or the amount of force needed to penetrate the cap. The instructional materials may also detail proper use of the collection device when the sample is to be exposed to reagents and conditions useful for amplifying a nucleic acid sequence targeted for detection.

Amplification prior to detection is particularly desirable in diagnostic assays where the initial population of targeted nucleic acid sequences in a sample is expected to be relatively small, making detection of the targeted nucleic acid sequences more difficult. There are many procedures for amplifying nucleic acids which are well known in the art, including, but not limited to, the polymerase chain reaction (PCR), (see, e.g., Mullis, "Process for Amplifying, Detecting, and/or Cloning Nucleic Acid Sequences," U.S. Pat. No. 4,683,195), transcription-mediated amplification (TMA), (see, e.g., Kacian et al., "Nucleic Acid Sequence Amplification Methods," U.S. Pat. No. 5,399,491), ligase chain reaction (LCR), (see, e.g., Birkenmeyer, "Amplification of Target Nucleic Acids Using Gap Filling Ligase Chain Reaction," U.S. Pat. No. 5,427,930), and strand displacement amplification (SDA), (see, e.g., Walker, "Strand Displacement Amplification," U.S. Pat. No. 5,455,166). The particular reagents (e.g., enzymes and primers) and conditions selected by practitioners will vary depending upon the particular nucleic acid sequence being targeted for detection and the specific amplification procedure to be followed. Those skilled in the art of nucleic acid diagnostics, however, will be able to select appropriate reagents and conditions for amplifying a specific targeted nucleic acid sequence following a particular amplification procedure without having to engage in undue experimentation.

While the present invention has been described and shown in considerable detail with reference to certain preferred embodiments, those skilled in the art will readily appreciate other embodiments of the present invention. Accordingly, the present invention is deemed to include all modifications and variations encompassed within the spirit and scope of the following appended claims.

What we claim is:

1. A penetrable screw cap comprising:
a generally cylindrical core structure configured to be screwed onto an open-ended vessel, the core structure being a molded plastic formed to have an opening extending therethrough; and
first and second frangible seals affixed to the core structure, the second seal being axially aligned with and positioned below the first seal in a spaced-apart relationship, each of the first and second seals comprising a foil, and the second seal being constructed and arranged to provide a barrier to the passage of a fluid through the opening formed in the core structure,
wherein the cap is capable of being penetrated by a plastic pipette tip, and
wherein the first and second seals are constructed and arranged so that air passageways are formed between a plastic pipette tip and the first and second seals when the pipette tip penetrates the first and second seals.

2. The cap of claim 1, wherein the core structure comprises an inwardly extending ledge, and wherein the second seal is affixed to a surface of the ledge.

3. The cap of claim 2, wherein the ledge comprises a depending skirt.

4. The cap of claim 3, wherein the second seal is affixed to a bottom surface of the skirt.

5. The cap of claim 2, wherein the first seal is affixed to a top surface of the core structure.

6. The cap of claim 1, wherein each of the first and second seals comprises a foil layer and a brittle layer.

7. The cap of claim 1, wherein each of the first and second seals comprises a foil layer, a heat seal layer and a brittle layer interposed between the foil layer and the heat seal layer.

8. The cap of claim 1, wherein each of the first and second seals comprises a foil layer and a combined brittle/heat seal layer.

9. The cap of claim 1, wherein the first seal is modified to facilitate penetration of the first seal by a plastic pipette tip, wherein the modification reduces the tensile strength of the first seal.

10. The cap of claim 9, wherein the first seal is modified to include perforations that facilitate penetration of the first seal by a plastic pipette tip.

11. The cap of claim 1 further comprising a filter interposed between the first and second seals.

12. The cap of claim 11, wherein the filter is comprised of a resilient material.

13. The cap of claim 11, wherein the filter is gas permeable.

14. The cap of claim 13, wherein the filter is constructed and arranged to trap an aerosol and/or bubbles.

15. The cap of claim 1, wherein the cap does not include a filter interposed between the first and second seals.

16. The cap of claim 1, wherein the first and second seals tear when penetrated by a plastic pipette tip, thereby forming air passageways between the pipette tip and the first and second seals.

17. A collection device comprising the cap of claim 1 screwed onto an open end of a fluid-holding vessel, thereby providing a substantially leak-proof seal between the cap and vessel.

18. A method for removing a fluid substance from the collection device of claim 17, the method comprising the steps of:
(a) penetrating the first and second seals with a plastic pipette tip, thereby forming air passageways between the pipette tip and the first and second seals;
(b) drawing a fluid substance contained in the vessel into the pipette tip; and
(c) removing the pipette tip from the collection device.

19. The method of claim 18, wherein the core structure comprises an inwardly extending ledge, and wherein the second seal is affixed to a surface of the ledge.

20. The method of claim 19, wherein the ledge comprises a depending skirt.

21. The method of claim 20, wherein the second seal is affixed to a bottom surface of the skirt.

22. The method of claim 19, wherein the first seal is affixed to a top surface of the core structure.

23. The method of claim 18, wherein each of the first and second seals comprises a foil layer and a brittle layer.

24. The method of claim 18, wherein each of the first and second seals comprises a foil layer, a heat seal layer and a brittle layer interposed between the foil layer and the heat seal layer.

25. The method of claim 18, wherein each of the first and second seals comprises a foil layer and a combined brittle/heat seal layer.

26. The method of claim 18 further comprising a filter interposed between the first and second seals.

27. The method of claim 26, wherein the filter is comprised of a resilient material.

28. The method of claim 26, wherein the filter is gas permeable.

29. The method of claim 28, wherein the filter is constructed and arranged to trap an aerosol and/or bubbles.

30. The method of claim 18, wherein the cap does not include a filter interposed between the first and second seals.

31. The method of claim 18, wherein the first and second seals are torn in step (a), thereby forming the air passageways between the pipette tip and the first and second seals.

32. The method of claim 18, wherein the collection device contains a specimen-retrieval device within an interior space of the collection device.

33. The method of claim 18 further comprising, after step (c), the step of amplifying a target nucleic acid sequence present in the fluid substance removed from the collection device in step (c).

34. The method of claim 18, wherein the second seal is welded to the core structure.

35. The method of claim 18, wherein the second seal is affixed to the core structure with an adhesive.

36. The cap of claim 1, wherein the second seal is welded to the core structure.

37. The cap of claim 1, wherein the second seal is affixed to the core structure with an adhesive.

* * * * *